US010510721B2

(12) United States Patent
Bhagavat et al.

(10) Patent No.: US 10,510,721 B2
(45) Date of Patent: Dec. 17, 2019

(54) MOLDED CHIP COMBINATION

(71) Applicants: Milind S. Bhagavat, Los Altos, CA (US); Lei Fu, Austin, TX (US); Ivor Barber, Los Altos, CA (US); Chia-Ken Leong, San Jose, CA (US); Rahul Agarwal, San Jose, CA (US)

(72) Inventors: Milind S. Bhagavat, Los Altos, CA (US); Lei Fu, Austin, TX (US); Ivor Barber, Los Altos, CA (US); Chia-Ken Leong, San Jose, CA (US); Rahul Agarwal, San Jose, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/675,214

(22) Filed: Aug. 11, 2017

(65) Prior Publication Data
US 2019/0051633 A1    Feb. 14, 2019

(51) Int. Cl.
| H01L 25/065 | (2006.01) |
| H01L 23/29 | (2006.01) |
| H01L 23/498 | (2006.01) |
| H01L 23/528 | (2006.01) |
| H01L 23/538 | (2006.01) |

(Continued)

(52) U.S. Cl.
CPC ......... *H01L 25/0657* (2013.01); *H01L 21/56* (2013.01); *H01L 23/293* (2013.01); *H01L 23/3135* (2013.01); *H01L 23/49816* (2013.01); *H01L 23/49822* (2013.01); *H01L 23/528* (2013.01); *H01L 23/5389* (2013.01); *H01L 21/568* (2013.01); *H01L 23/3128* (2013.01); *H01L 23/36* (2013.01); *H01L 2224/18* (2013.01); *H01L 2225/06513* (2013.01); *H01L 2225/06517* (2013.01)

(58) Field of Classification Search
CPC .............. H01L 51/56; H01L 51/0097; H01L 2251/5338; H01L 33/62; H01L 51/5056
USPC ........................................ 257/702
See application file for complete search history.

(56) References Cited

U.S. PATENT DOCUMENTS

| 5,998,243 A | 12/1999 | Odashima et al. |
| 6,258,626 B1 | 7/2001 | Wang et al. |

(Continued)

FOREIGN PATENT DOCUMENTS

| EP | 1909546 A1 | 4/2008 |
| WO | WO2006134914 A1 | 12/2006 |
| WO | WO 2017111957 | 6/2017 |

OTHER PUBLICATIONS

Tom Krazit; *Intel shows off 80-core processor*; http://news.com.com/Intel+shows+off+80-core+processor/2100-1006_3; Feb. 11, 2007; pp. 1-3.

(Continued)

*Primary Examiner* — Andy Huynh
(74) *Attorney, Agent, or Firm* — Timothy M. Honeycutt

(57) ABSTRACT

Various molded chip combinations and methods of manufacturing the same are disclosed. In one aspect, a molded chip combination is provided that includes a first semiconductor chip that has a first PHY region, a second semiconductor chip that has a second PHY region, an interconnect chip interconnecting the first PHY region to the second PHY region, and a molding joining together the first semiconductor chip, the second semiconductor chip and the interconnect chip.

20 Claims, 17 Drawing Sheets

(51) Int. Cl.
*H01L 23/31* (2006.01)
*H01L 21/56* (2006.01)
*H01L 23/36* (2006.01)

(56) References Cited

U.S. PATENT DOCUMENTS

| | | | |
|---|---|---|---|
| 6,339,254 | B1 | 1/2002 | Venkateshwaran et al. |
| 6,468,833 | B2 | 10/2002 | Uner et al. |
| 6,576,540 | B2 | 6/2003 | Hsu et al. |
| 6,583,502 | B2 | 6/2003 | Lee et al. |
| 6,593,662 | B1 | 7/2003 | Pu et al. |
| 6,717,253 | B2 | 4/2004 | Yang |
| 6,820,329 | B2 | 11/2004 | Fang |
| 6,853,064 | B2 | 2/2005 | Bolken et al. |
| 6,853,084 | B2 | 2/2005 | Hsu et al. |
| 6,916,685 | B2 | 7/2005 | Yang et al. |
| 7,041,591 | B1 | 5/2006 | Lee et al. |
| 7,057,277 | B2 | 6/2006 | Chen et al. |
| 7,081,402 | B2 | 7/2006 | Hsu et al. |
| 7,109,576 | B2 | 9/2006 | Bolken et al. |
| 7,198,980 | B2 | 4/2007 | Jiang et al. |
| 7,396,753 | B2 | 7/2008 | Chu et al. |
| 7,399,399 | B2 | 7/2008 | Chou et al. |
| 7,485,970 | B2 | 2/2009 | Hsu et al. |
| 7,528,474 | B2 | 5/2009 | Lee |
| 7,545,048 | B2 | 6/2009 | Meyer et al. |
| 7,554,203 | B2 | 6/2009 | Zhou et al. |
| 7,799,608 | B2 | 9/2010 | Chan et al. |
| 8,298,945 | B2 | 10/2012 | Leung et al. |
| 8,901,748 | B2 | 12/2014 | Manusharow et al. |
| 8,946,900 | B2 | 2/2015 | Qian et al. |
| 9,059,179 | B2 | 6/2015 | Karikalan et al. |
| 9,223,541 | B2 | 12/2015 | Barakat |
| 9,240,377 | B2 | 1/2016 | Qian et al. |
| 9,443,824 | B1 | 9/2016 | We et al. |
| 9,542,522 | B2 | 1/2017 | Qian et al. |
| 2002/0006686 | A1 | 1/2002 | Cloud et al. |
| 2002/0172026 | A1 | 11/2002 | Chong et al. |
| 2003/0016133 | A1 | 1/2003 | Egbert |
| 2003/0111733 | A1 | 6/2003 | Pogge et al. |
| 2004/0106229 | A1 | 6/2004 | Jiang et al. |
| 2009/0135574 | A1 | 5/2009 | Tanaka et al. |
| 2011/0010932 | A1 | 1/2011 | Tanaka et al. |
| 2011/0285006 | A1 | 11/2011 | Weng et al. |
| 2012/0007211 | A1 | 1/2012 | Aleksov et al. |
| 2012/0110217 | A1 | 5/2012 | Christiansen et al. |
| 2012/0286419 | A1 | 11/2012 | Kwon et al. |
| 2013/0049127 | A1 | 2/2013 | Chen et al. |
| 2013/0168854 | A1 | 7/2013 | Karikalan et al. |
| 2014/0102768 | A1 | 4/2014 | Shizuno et al. |
| 2014/0159228 | A1 | 6/2014 | Teh et al. |
| 2014/0185264 | A1* | 7/2014 | Chen .................... H01L 23/3128 361/814 |
| 2014/0264791 | A1 | 9/2014 | Manusharow et al. |
| 2014/0264831 | A1* | 9/2014 | Meyer ................. H01L 21/4846 257/737 |
| 2014/0332966 | A1 | 11/2014 | Xiu et al. |
| 2015/0001717 | A1 | 1/2015 | Karhade et al. |
| 2015/0001733 | A1 | 1/2015 | Karhade et al. |
| 2015/0048515 | A1 | 2/2015 | Zhang et al. |
| 2015/0092378 | A1 | 4/2015 | Roy et al. |
| 2015/0171015 | A1* | 6/2015 | Mahajan ............. H01L 23/5381 257/712 |
| 2015/0181157 | A1 | 6/2015 | Kuo et al. |
| 2015/0228583 | A1 | 8/2015 | Karhade et al. |
| 2015/0311182 | A1 | 10/2015 | Lee et al. |
| 2015/0340459 | A1 | 11/2015 | Lee |
| 2016/0085899 | A1 | 3/2016 | Qian et al. |
| 2016/0133571 | A1 | 5/2016 | Lee et al. |
| 2016/0181189 | A1 | 6/2016 | Qian et al. |
| 2017/0207204 | A1* | 7/2017 | Lin ....................... H01L 25/105 |

OTHER PUBLICATIONS

Ron Huemoeller et al.; *Silicon wafer integrated fan-out technology*; ChipScaleReview.com; Mar./Apr. 2015; pp. 1-4.
U.S. Appl. No. 15/961,222, dated Apr. 24, 2018, Bhagavat et al.
Wikipedia; *Physical Layer*; https://en.wikipedia.org/wiki/Physical_layer; Jan. 2015; pp. 1-5.
USPTO Office Action notification dated Feb. 7, 2019; U.S. Appl. No. 15/961,222.
PCT/US2018/044342 International Search Report dated Nov. 30, 2018.

* cited by examiner

MOLDED CHIP COMBINATION

BACKGROUND OF THE INVENTION

A conventional type of multi-chip module includes two semiconductor chips mounted side-by-side on a carrier substrate or in some cases on an interposer (so-called "2.5D") that is, in-turn, mounted on a carrier substrate. The semiconductor chips are flip-chip mounted to the carrier substrate and interconnected thereto by respective pluralities of solder joints. The carrier substrate is provided with plural electrical pathways to provide input/output pathways for the semiconductor chips both for inter-chip power, ground and signal propagation as well as input/output from the interposer itself. The semiconductor chips include respective underfill material layers to lessen the effects of differential thermal expansion due to differences in the coefficients of thermal expansion of the chips, the interposer and the solder joints.

One conventional variant of 2.5D interposer-based multi-chip modules uses a silicon interposer with multiple internal conductor traces for interconnects between two chips mounted side-by-side on the interposer. The interposer is manufactured with multitudes of through-silicon vias (TSVs) to provide pathways between the mounted chips and a package substrate upon which the interposer is mounted. The TSVs and traces are fabricated using large numbers of processing steps.

Another conventional multi-chip module technology is 2D wafer-level fan-out (or 2D WLFO). Conventioal 2D WLFO technology is based on embedding die into a molded wafer, also called "wafer reconstitution." The molded wafer is processed through a standard wafer level processing flow to create the final integrated circuit assembly structure. The active surface of the dies are coplanar with the mold compound, allowing for the "fan-out" of conductive copper traces and solder ball pads into the molded area using conventional redistribution layer (RDL) processing. Conventional 3D WLFO extends the 2D technology into multi-chip stacking where a second package substrate is mounted on the 2D WLFO.

Some other conventional designs use embedded interconnect bridges (EMIB). These are typically silicon bridge chips (but occasionally organic chiplets with top side only input/outputs) that are embedded in the upper reaches of a package substrate.

BRIEF DESCRIPTION OF THE DRAWINGS

The foregoing and other advantages of the invention will become apparent upon reading the following detailed description and upon reference to the drawings in which.

DETAILED DESCRIPTION

Figure 1:
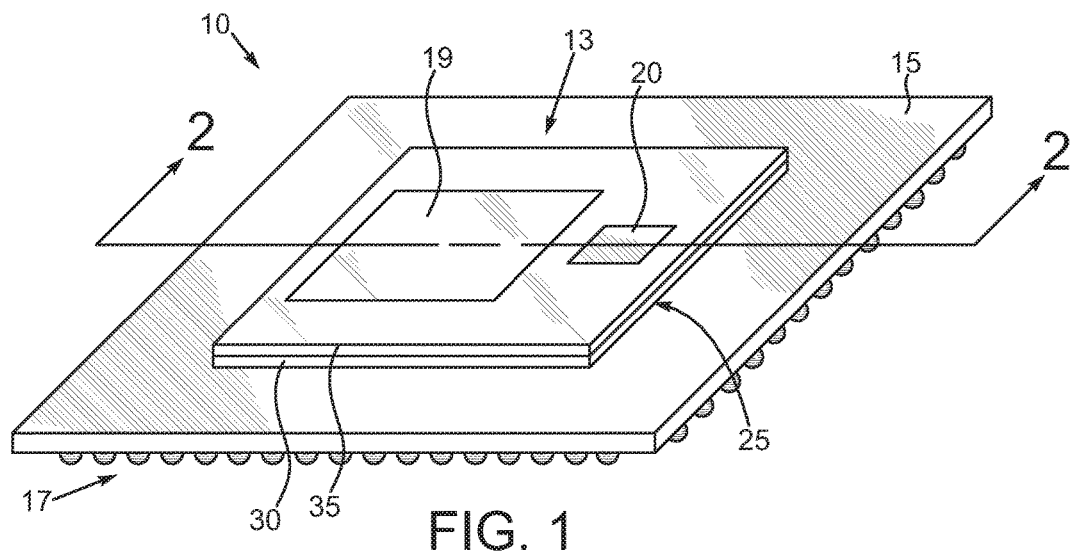
FIG. 1 is a pictorial view of an exemplary semiconductor chip device that includes an exemplary molded chip combination.

Chip geometries have continually fallen over the past few years. However the shrinkage in chip sizes has been accompanied by an attendant increase in the number of input/outputs for a given chip. This has led to a need to greatly increase the number of chip-to-chip interconnects for multi-chip modules. Current 2D and 3D WLFO have limited minimum line spacing, on the order of 2.0 µm/line and space. In addition, conventional WLFO techniques use multiple cured polyimide films to create the requisite RDL layers. These polyimide films tend to be mechanical stress, and thus warpage, sources and their relatively high bake temperatures can adversely impact other sensitive devices. Finally, pick and place accuracy of chips in both WLFO and EMIB remains a challenge.

In accordance with one aspect of the present invention, a molded chip combination is provided that includes a first semiconductor chip that has a first PHY region, a second semiconductor chip that has a second PHY region, an interconnect chip interconnecting the first PHY region to the second PHY region, and a molding joining together the first semiconductor chip, the second semiconductor chip and the interconnect chip.

The molded chip combination wherein the first semiconductor chip includes a first plurality of interconnects to connect to a circuit board when the molded chip combination is mounted on the circuit board and the second semiconductor chip includes a second plurality of interconnects to connect to the circuit board when the molded combination is mounted on the circuit board.

The molded chip combination wherein the first semiconductor chip includes a first non-PHY region connected to the first interconnects and the second semiconductor chip includes a second non-PHY region connected to the second interconnects.

The molded chip combination wherein the molding includes a first molding material layer and a second molding material layer.

The molded chip combination including a polymer layer positioned between the first molding material layer and the second molding material layer.

The molded chip combination including a circuit board and the molded chip combination mounted on the circuit board.

The molded chip combination wherein the first semiconductor chip comprises a processor and the second semiconductor chip comprises a memory chip.

In accordance with another aspect of the present invention, a molded chip combination is provided that includes a first semiconductor chip that has a first PHY region, a second semiconductor chip that has a second PHY region, an interconnect chip interconnecting the first PHY region to the second PHY region, a first molding material layer joining together the first semiconductor chip and the second semiconductor chip, and a second molding material layer joined to the first molding material layer and at least partially encapsulating the interconnect chip.

The molded chip combination wherein the first semiconductor chip includes a first plurality of interconnects to connect to a circuit board when the molded chip combination is mounted on the circuit board and the second semiconductor chip includes a second plurality of interconnects to connect to the circuit board when the molded combination is mounted on the circuit board.

The molded chip combination wherein the first semiconductor chip includes a first non-PHY region connected to the first interconnects and the second semiconductor chip includes a second non-PHY region connected to the second interconnects.

The molded chip combination including a polymer layer positioned between the first molding material layer and the second molding material layer.

The molded chip combination including a circuit board and the molded chip combination mounted on the circuit board.

The molded chip combination wherein the first semiconductor chip comprises a processor and the second semiconductor chip comprises a memory chip.

In accordance with another aspect of the present invention, a method of manufacturing a molded chip combination is provided. The method includes interconnecting a first PHY region of a first semiconductor chip to a second PHY region of a second semiconductor chip with an interconnect chip, and molding together the first semiconductor chip, the second semiconductor chip and the interconnect chip.

The method including fabricating a first plurality of interconnects on the first semiconductor chip to connect to a circuit board when the molded chip combination is mounted on the circuit board and a second plurality of interconnects on the second semiconductor chip to connect to the circuit board when the molded combination is mounted on the circuit board.

The method wherein the first semiconductor chip includes a first non-PHY region connected to the first interconnects and the second semiconductor chip includes a second non-PHY region connected to the second interconnects.

The method wherein the molding comprises molding the first semiconductor chip to the second semiconductor chip with a first molding material layer and molding a second molding material layer to at least partially encapsulate the interconnect chip.

The method including applying a polymer layer between the first molding material layer and the second molding material layer.

The method including mounting the molded chip combination on a circuit board.

The method wherein the first semiconductor chip comprises a processor and the second semiconductor chip comprises a memory chip.

In the drawings described below, reference numerals are generally repeated where identical elements appear in more than one figure. Turning now to the drawings, and in particular to FIG. 1 which is a pictorial view of an exemplary semiconductor chip device 10.

The semiconductor chip device 10 includes a molded chip combination 13, which can be mounted on a circuit board 15, which can be a system board, circuit card, a semiconductor chip package substrate or otherwise. The circuit board 15 can interface electrically with some other electrical structure, such as another circuit board or other structure by way of plural interconnect structures 17 which in this arrangement constitute solder balls. However, the skilled artisan will appreciate that various types of interconnect structures could be used other than solder balls, such as, pins, land grid array structures or other types of interconnects. The molded chip combination 13 includes plural semiconductor chips, two of which are shown and labeled 19 and 20, respectively, and both of which are at least partially encapsulated in a molding material 25. In this arrangement, the molding material 25 can consist of two molding layers 30 and 35. As described in more detail below, the semiconductor chips 19 and 20 can be electronically connected by way of another semiconductor chip that is obscured by the molding material 25, and thus not visible in FIG. 1, but will be described below and shown in subsequent figures.

Figure 2:
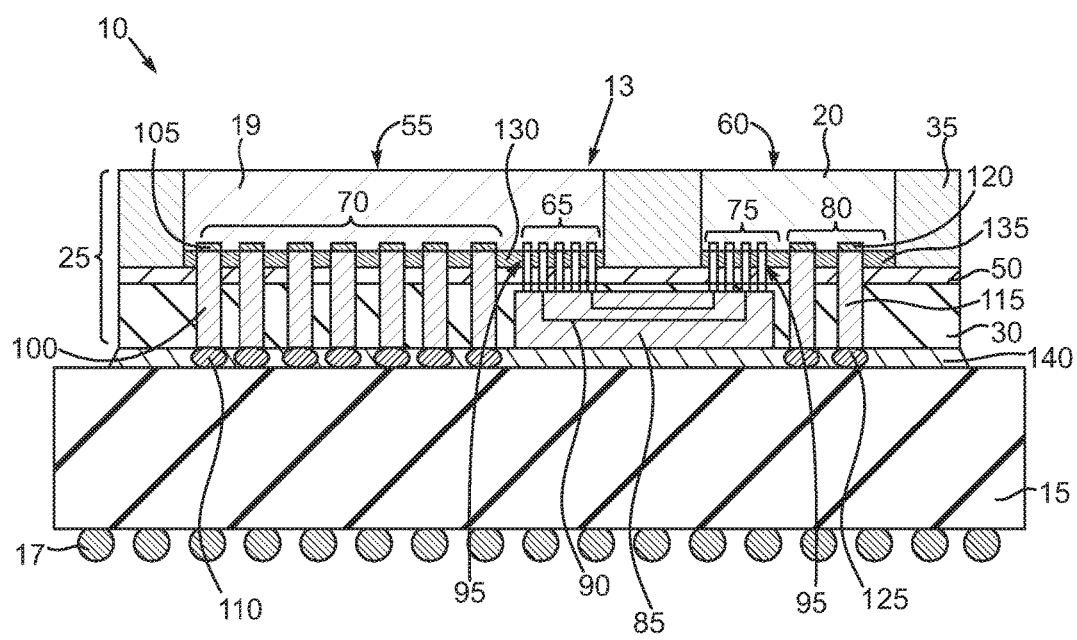
FIG. 2 is a sectional view of FIG. 1 taken at section 2-2.

Additional details of the semiconductor chip device 10 can be understood by referring now also to FIG. 2, which is a sectional view of FIG. 1 taken at section 2-2. The molding material 25 of the molded chip combination 13 consists of the molding layer 30, the molding layer 35 and a polymer layer 50 sandwiched between the molding layers 30 and 35. The molding layer 35 surrounds the semiconductor chips 19 and 20 laterally but the respective upper surfaces 55 and 60 of the semiconductor chips 19 and 20 remain exposed to facilitate the subsequent optional placement of a heat spreader on the semiconductor chips 19 and 20. It is desirable for the materials selected for the molding layers 30 and 35 to exhibit suitable viscosity at the applicable molding temperatures and have molding temperatures lower than the melting points of any of the solder structures present at the time of the molding processes. In an exemplary arrangement the materials for the molding layers 30 and 35 can have a molding temperature of about 165° C. Two commercial variants are Sumitomo EME-G750 and G760.

The semiconductor chips 19 and 20 can be any of a variety of integrated circuits. A non-exhaustive list of examples includes microprocessors, graphics processing units, application processing units that combines aspects of both, memory devices, an application integrated specific circuit or other. The semiconductor chip 19 is constructed with a physical device or "PHY" region, which has various internal and external conductor structures dedicated to the transmission of chip-to-chip signals, and a non-PHY region 70, which has conductor structures that are tailored more to the conveyance of power and ground and/or chip-to-circuit board signals. The semiconductor chip 20 similarly includes a PHY region 75 and a non-PHY region 80 that had the same functions as the PHY region 65 and the non-PHY region 70 of the semiconductor chip 19. As noted briefly above, the semiconductor chips 19 and 20 are connected electrically by way of another semiconductor chip, namely, an interconnect chip 85. The semiconductor chips 19 and 20 and the interconnect chip 85 can be constructed of silicon, germanium or other semiconductor materials and be bulk semiconductor, semiconductor on insulator or other designs. The interconnect chip 85 includes multitudes of internal conductor traces, which can be on multiple levels or single levels as desired. Two of the traces are shown and labeled collectively 90. The traces 90 interface electrically with conductor structures of the PHY regions 65 and 75 of the semiconductor chips 19 and 20 by way of conducting pathways 95, which are of such scale and size in FIG. 2 that cross-hatching is not practical and thus are depicted as multitudes of white stacks of three rectangles each. However, a subsequent figure will depict additional details of these conductive pathways 95. The non-PHY region 70 of the semiconductor chip 19 can interface electrically with the circuit board 15 by way of plural conductive pillars 100. Each conductive pillar 100 is connected electrically to the semiconductor chip 19 by way of a respective conductor pad 105 and to the circuit board 15 by way of a solder interconnect 110, which can be a solder bump or micro bump as desired. The non-PHY region 80 of the semiconductor chip 20 is similarly electrically connected to the circuit board 15 by way of plural conductive pillars 115, conductor pads 120 and solder bumps 125, which can be substantially like the conductive pillars 100, pads 105 and solder bumps 110 of the semiconductor chip 19. Note that the conductive pillars 100 traverse plural insulating layers, namely, starting from bottom to top, the molding layer 30, the polymer layer 50 and a passivation structure 130. The passivation structure 130 can be a laminate of various insulating materials such as, silicon dioxide, silicon nitride, or other dielectric materials. The conductive pillars 115 similarly traverse the molding layer 30, the polymer layer 50, and a passivation structure 135 of the semiconductor chip 20, which can be like the passivation structure 130 just described. The conductive pillars 100 and 115 can be composed of various conductor materials, such as copper and others to be described in more detail below. The conductive pads 105 and 120 can be composed of aluminum, copper or various other conductor materials. The solder bumps 110 and 125 can be composed of various well-known solder compositions, such as tin-silver, tin-silver-copper or others. The polymer layer 50 is preferably composed of polybenzoxazoles, although other polymeric materials could be used, such as benzocyclobutene, low temperature polyimide or other polymers with a cure temperature below about 200° C. The polymer layer 50 is designed to act as a stress buffer, an isolation film and can enable redistribution layer routing.

The circuit board 15 can be organic or ceramic and single, or more commonly, multilayer. To cushion against the effects of mismatched coefficients of thermal expansion, an underfill material 140 can be positioned between the molding layer 30 and the upper surface of the circuit board 15 and can extend laterally beyond the left and right edges (and those edges not visible) of the molding layer 30 as desired. The underfill material 140 can be composed of well-known polymeric underfill materials.

Figure 3:
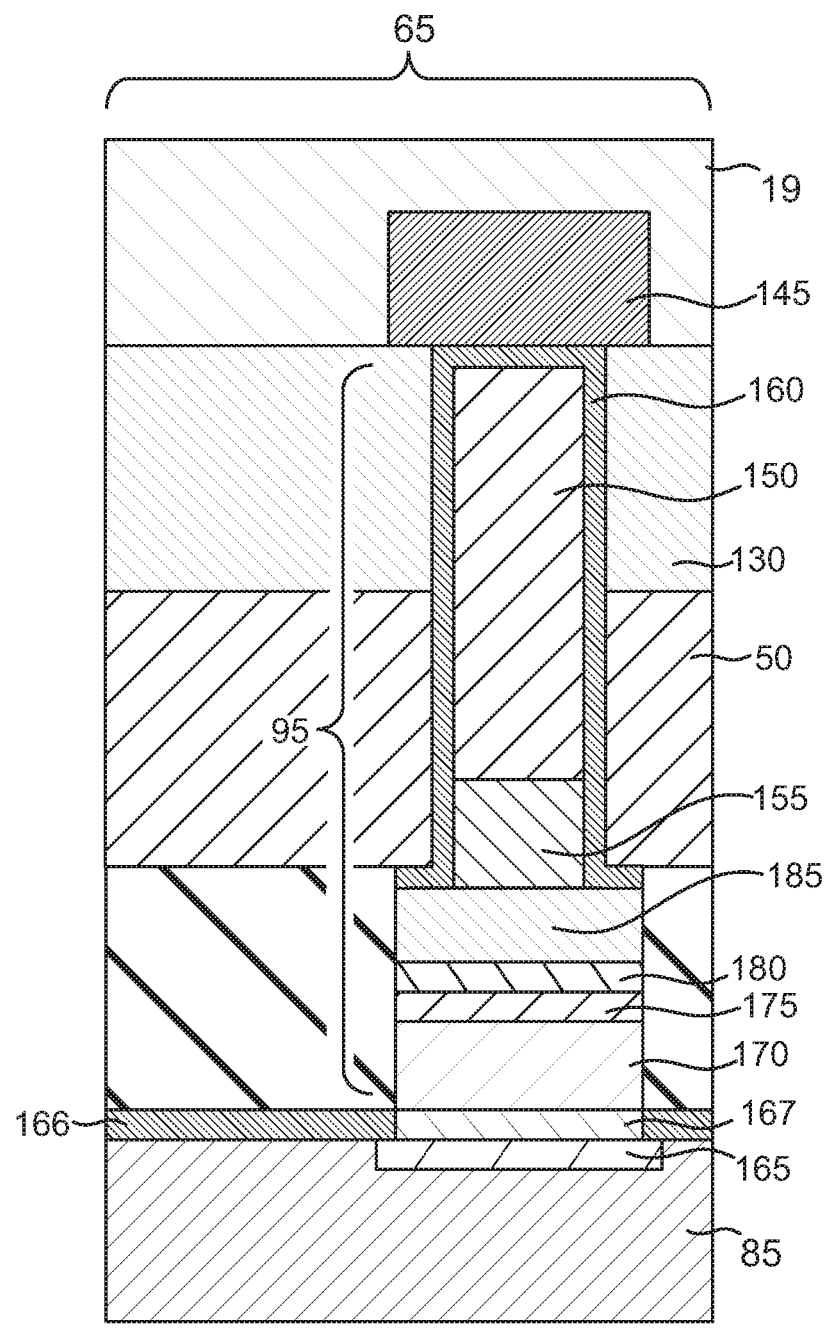
FIG. 3 is a portion of FIG. 2 shown at increased magnification.

Additional details of the conductive pathways 95 between the PHY regions 65 and 75 and the interconnect chip 85 can be understood by referring now also to FIG. 3, which depicts a portion of one of the conductive pathways 95 associated with the interconnect chip 85 and the PHY region 65 of the chip 19. It should be understood that this description will be illustrative of the other conductive pathways 95 as well. The portion of the conductive pathway 95 associated with the semiconductor chip 19 can include a conductor pad 145 that is connected to other conductor traces or vias in the semiconductor chip that are not visible and a conductive micro pillar 150 that is capped with a nickel-gold cap 155. The nickel-gold cap 155 functions as a barrier layer and solder wettable surface. Other possible materials include nickel-vanadium, platinum, palladium, pure gold or the like. An underbump metallization 160 is positioned between the conductive pillar 150 and the conductor pad 145. The conductor pad 145 can be constructed of aluminum, copper, gold, silver, combinations of these or the like. The UBM structure 160 can be composed of sputtered titanium, tungsten and copper and can also include nickel, vanadium or other materials. Note that the combination of the underbump metallization 160, the conductive micro pillar 150 and the nickel-gold cap 155 traverse the passivation structure 130 of the semiconductor chip 19 and the polymer layer 50. The portion of the conductive pathway 95 associated with the interconnect chip 85 can include a conductor pad 165 that, like the conductor pad 145, is connected electrically to one or more conductive traces or vias that are disposed in the interconnect chip 85, but which are not shown for simplicity of illustration. A passivation structure 166, composed of the same types of materials as the passivation structures 130 and 135 described elsewhere herein, partially covers the conductor pad 165. A barrier/adhesion layer 167 is formed on the conductor pad 165 and composed preferably of Ti—W and copper, followed by and proceeding upward in the figure, a copper layer 170, a nickel layer 175 and another copper layer 180. The copper layer 180 is capped with a solder micro bump 185. The skilled artisan will appreciate that the selection of conductor materials can be varied depending upon the constituents involved. For example, nickel, gold and nickel and gold or even vanadium can serve as barrier layers to prevent the migration of solder constituents into other conductive layers or vice versa. The solder micro bump 185 can be composed of a variety of preferably lead-free solder, such as, tin-copper-silver, tin-silver or other types of solders. The nickel-gold cap 155 is designed to provide a good solder wettable layer for the solder micro bump 185 while also providing a barrier layer functionality. As noted above, the conductor pathway 95 depicted in FIG. 3 can be used for the other conductive pathways 95 depicted in FIG. 2 and described above.

Figure 4:
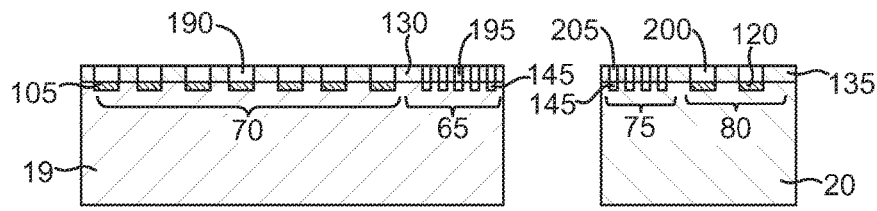
FIG. 4 is a sectional view depicting exemplary temporary multi-chip mounting.

An exemplary process to fabricate the semiconductor chip device 10 depicted in FIGS. 1 and 2 can be understood by referring now to FIGS. 4, 5, 6, 7, 8, 9, 10, 11, 12, 13, 14, 15, 16, 17, 18, 19 and 20 and initially to FIG. 4. FIG. 4 depicts the semiconductor chips 19 and 20 in section and as free standing semiconductor chips in the state that they would be in prior to assembly into the molded chip combo 13 depicted in FIGS. 1 and 2. Note that in FIG. 4, the semiconductor chips 19 and 20 are shown flipped over from the orientation depicted in FIGS. 1 and 2. The semiconductor chips 19 and 20 can be manufactured en masse in semiconductor wafers (not shown) which are subsequently singulated to yield the individual semiconductor chips 19 and 20. During these fabrication processes, the various electronic structures that include transistors, capacitors, inductors and whatever other logic elements and circuit structures that are appropriate for the chips 19 and 20 can be constructed and the aforementioned PHY regions 65 and 75 and non-PHY regions 70 and 80 can be established in the chips 19 and 20, respectively. In this regard, the semiconductor chip 19 can be manufactured up to the point where the conductor pads 105 and 145 have been fabricated along with the passivation structure 130 and plural openings 190 in the passivation structure 130 that expose the underlying conductor pads 105 and plural openings 195 through the passivation structure 130 that lead to the conductor pads 145. The semiconductor chip 20 can be similarly manufactured up to the point where the conductor pads 120 in the non-PHY region 80 have been fabricated and the conductor pads 145 in the PHY region 75 have been established as well as openings 200 in the passivation structure 135 and plural openings 205 also in the passivation structure 135 that lead to the conductor pads 145. The conductor pads 105, 120 and 145 can be fabricated using well-known material deposition techniques, such as, plating, sputtering, chemical vapor deposition, combinations of these or the like. The openings 190, 195, 200 and 205 can be formed using well-known photolithography and directional etching techniques.

Figure 5:
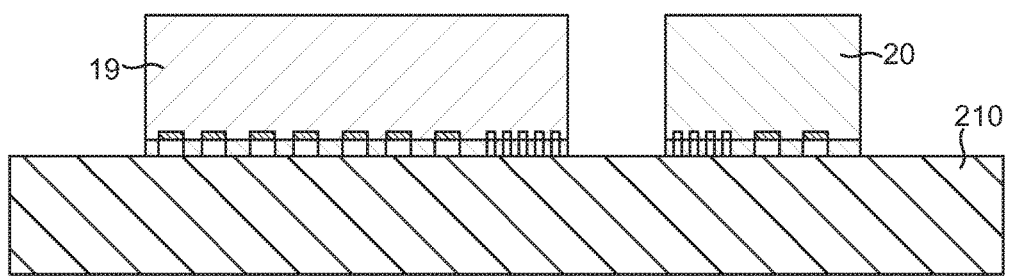
FIG. 5 is a sectional view depicting exemplary temporary multi-chip mounting.

Next and as shown in FIG. 5, the semiconductor chips 19 and 20 can be flipped over from the orientation shown in FIG. 4 and mounted to a carrier substrate 210. The semiconductor chips 19 and 20 can be secured to the carrier substrate 210 by way of a light-activated adhesive (not shown) or other temporary fastening technique since it is intended that the carrier wafer 210 be subsequently removed following various processing steps.

Figure 6:
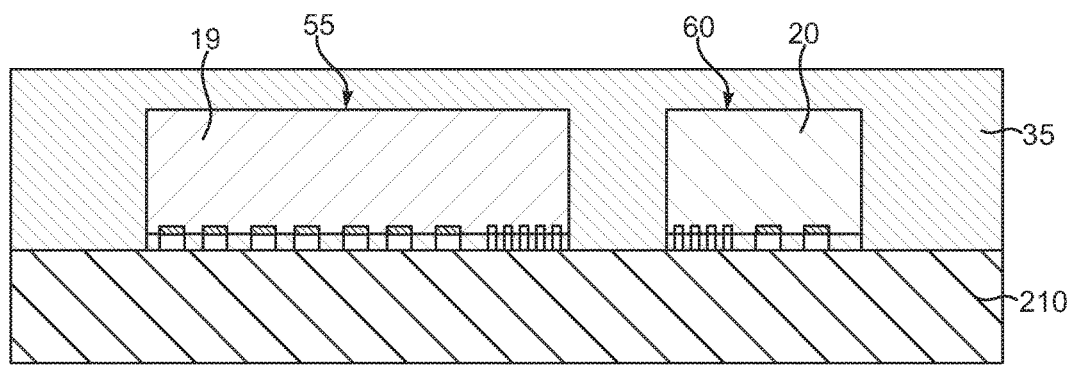
FIG. 6 is a sectional view depicting exemplary molding of multiple chips.
Figure 7:
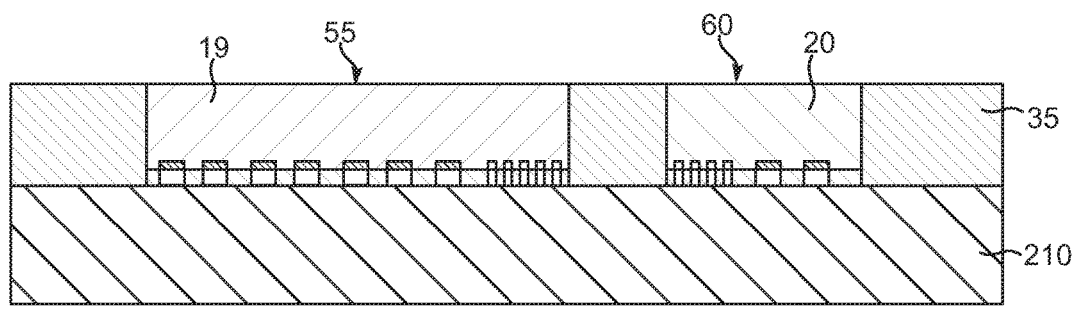
FIG. 7 is a sectional view depicting additional processing of the chips.

Next and as depicted in FIG. 6, the molding layer 35 is formed by compression molding of a suitable compound, such as, Sumitomo EME-G750 or G760 at about 165° C. for about 60 to 120 minutes. This compression molding process will initially encapsulate the semiconductor chips 19 and 20 and cover the otherwise uncovered portions of the carrier substrate 210. Because it is desirable to expose the upper surfaces 55 and 60 of the semiconductor chips 19 and 20, respectively, the molding layer 35 can undergo a grinding process as depicted in FIG. 7 to expose those surfaces 55 and 60. At this point, the semiconductor chips 19 and 20 remain mounted on the carrier substrate 210 but mechanically joined laterally by way of the molding layer 35.

Figure 8:
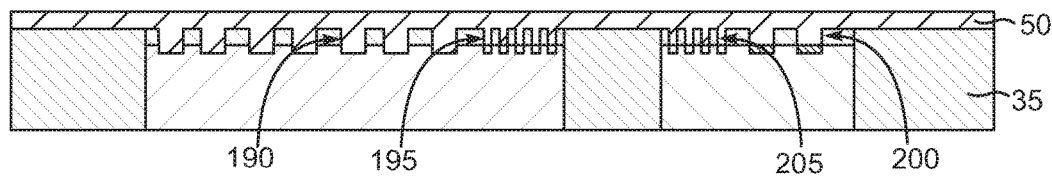
FIG. 8 is a sectional view depicting additional processing of the chips.
Figure 9:
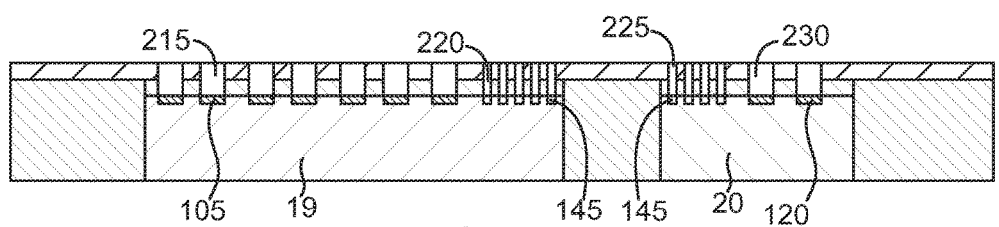
FIG. 9 is a sectional view depicting additional processing of the chips.

Next, and as shown in FIG. 8, the semiconductor chips 19 and 20 and molding layer 35 can be separated from the carrier substrate 210 depicted in FIG. 7 and flipped over from the orientation depicted in FIG. 7. At this point, the polymer layer 50 can be applied over both the semiconductor chips 19 and 20 and the molding layer 35. The polymer layer 50 can be applied using well-known spin coating and baking techniques, and since a blanket deposition process can be used, the various openings 190, 195, 200 and 205 can fill with the polymer layer 50 material at this point. As shown in FIG. 9, in order to re-expose the various conductor pads 105 and 145 of the semiconductor chip 19 and the conductor pads 120 and 145 of the semiconductor chip 20, the polymer layer 50 can be suitably masked and lithographically patterned, that is, by way of photolithography, in order to establish openings 215 to the conductor pads 105, openings 220 to the conductor pads 145 and the semiconductor chip 19 and openings 220 and 225 to the conductor pads 145 and 120 of the semiconductor chip 20, respectively.

Figure 10:
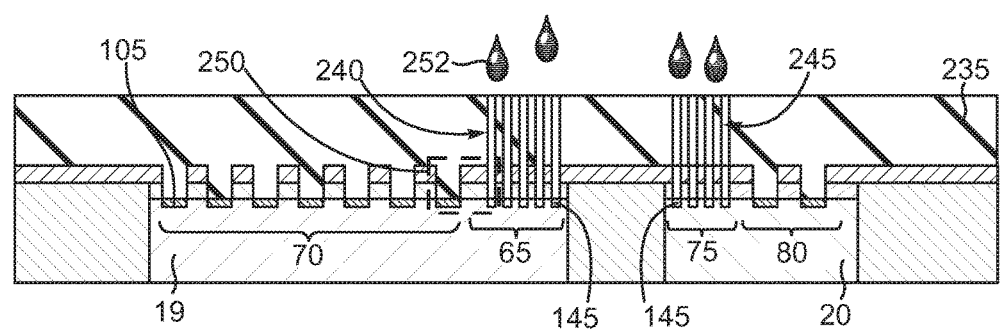
FIG. 10 is a sectional view depicting additional processing of the chips.
Figure 11:
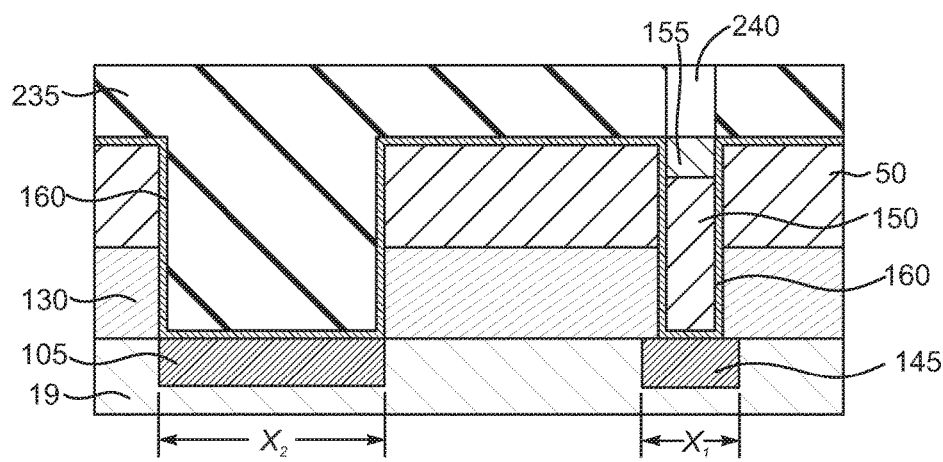
FIG. 11 is a sectional view depicting a portion of FIG. 10 at greater magnification.

Next and as shown in FIG. 10, a resist mask 235 is applied over the polymer layer 50 and suitably patterned to establish openings 240 that lead to the conductor pads 145 of the semiconductor chip 19 and openings 245 that lead to the conductor pads 145 of the semiconductor chip 20. Here, the purpose of the resist mask 235 is to mask the conductor pads 105 and 120 of the semiconductor chips 19 and 20, respectively, so that the various conductor structures associated with the conductor pads 145 of each of the chips 19 and 20 can be fabricated. Additional details of this fabrication step can be understood by referring now also to FIG. 11, which is the portion of FIG. 10 circumscribed by the dashed rectangle 250, shown at greater magnification. Note that box 250 circumscribes a portion of the PHY region 65 of the semiconductor chip 19 and thus one of the conductor pads 105 and one of the conductor pads 145. It should be understood that the structures illustrated in FIG. 11 are illustrative of the other similar conductor structures of the semiconductor chip 19 and those conductor structures in the PHY region 75 of the chip 20. It should also be understood that, as shown in FIG. 11, prior to the application of the resist mask 235, the UBM 160 (also depicted in FIG. 3) can be deposited using well-known sputter and/or CVD techniques. This sputter process can blanket deposit the UBM 160 as shown. Thereafter, the resist mask 235 can be applied by spin coating and baking using well-known techniques. The openings 240, one of which is illustrated in FIG. 11, can be photolithographically patterned in the resist mask 235 and thereafter, the micro pillar 150 can be fabricated using the techniques described above in conjunction with FIG. 3 as well as the nickel-gold cap 155. Application of multiple conductor materials 252 is by way of the openings 240 and the similar openings 245. As noted above, the micro pillar 150 traverses the passivation structure 130 of the semiconductor chip 19 and a portion of the polymer layer 50. Note that the conductor pads 145 and 105 in this illustrated arrangement are fabricated with respective lateral dimensions (diameters or possibly other shapes) $x_1$ and $x_2$ where $x_2 > x_1$. However, in another arrangement described below, the semiconductor chip 19 is manufactured with $x_1$ and $x_2$ being approximately the same size. This circumstance presents a technical issue that is addressed by a another disclosed technique.

Figure 12:
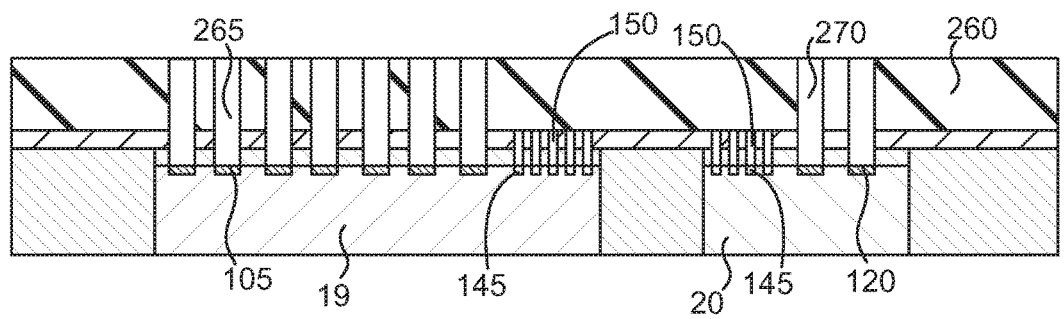
FIG. 12 is a sectional view depicting additional processing of the chips.

Next and as shown in FIG. 12, the resist mask 235 shown in FIG. 11 is stripped using well-known ashing and solvent stripping techniques and another resist mask 260 is applied using well-known spin coating and baking techniques and patterned so as to cover the conductor pads 145 and micro pillars 150 of each of the semiconductor chips 19 and 20 but with openings 265 that lead to the underlying conductor pads 105 of the semiconductor 19 and openings 270 that lead to the underlying conductor pads 120 of the semiconductor chip 20.

Figure 13:
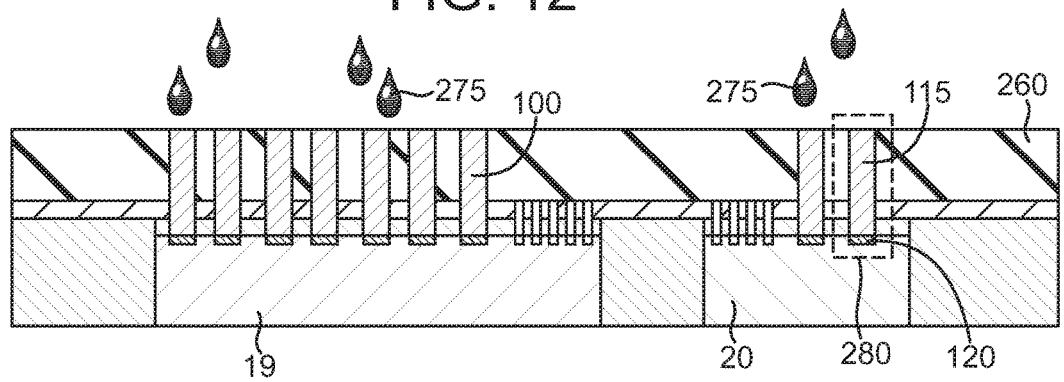
FIG. 13 is a sectional view depicting additional processing of the chips.
Figure 14:
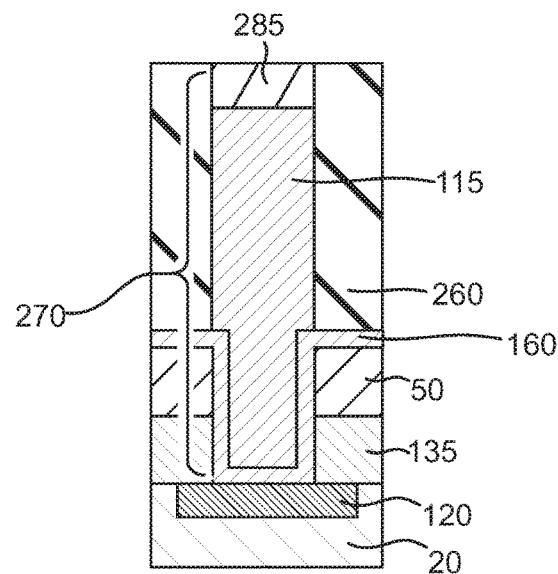
FIG. 14 is a sectional view depicting a portion of FIG. 13 at greater magnification.

Next and as shown in FIG. 13, a plurality of material deposition steps are performed to deposit conductor materials schematically represented by the droplets 275 to fabricate conductive pillars 100 and 115 of the semiconductor chips 19 and 20, respectively. Additional details of these material fabrication processes can be understood by referring now also to FIG. 14, which is the portion of FIG. 13 circumscribed by the dashed rectangle 280 shown at greater magnification. As shown in FIG. 14, prior to the application of the resist mask 260 and the patterning of the openings 270 therein, the aforementioned UBM structure 160 deposited prior to the resist mask 235 depicted in FIG. 10 is still in position. Here, the conductive pillars 115 can be fabricated using well-known plating techniques that can consist of a biased plating process using the UBM structure 160 as a plating electrode. Copper, copper and silver, copper and tin or other types of materials can be used. Following the plating of the conductive pillar 115, a solder cap 285 is fabricated on the pillar 115 by plating, or alternatively by a stencil and paste process. Note how the UBM structure 160 is positioned on and in ohmic contact with the conductor pad 120 and the combination of the UBM structure 160 and the lower reaches of the conductive pillar 115 extend vertically through the passivation structure 135 and a portion of the polymer layer 50 on the semiconductor chip 20.

Figure 15:
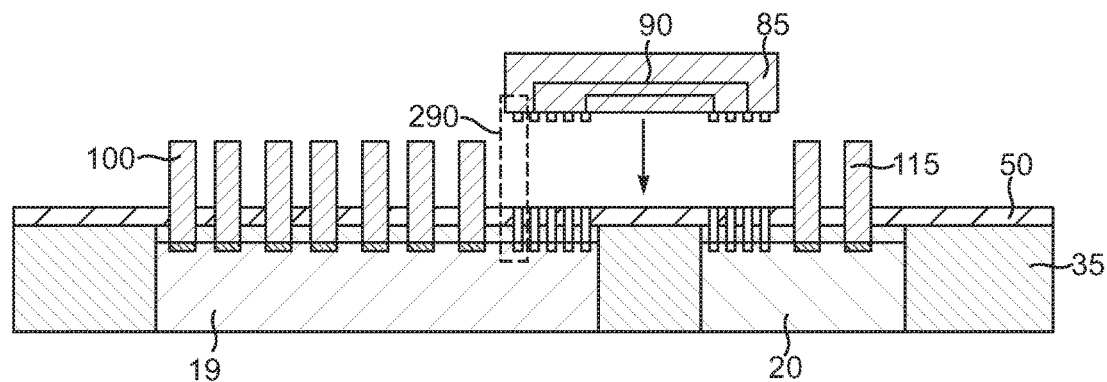
FIG. 15 is a sectional view depicting exemplary mounting of an interconnect chip on the chips.
Figure 16:
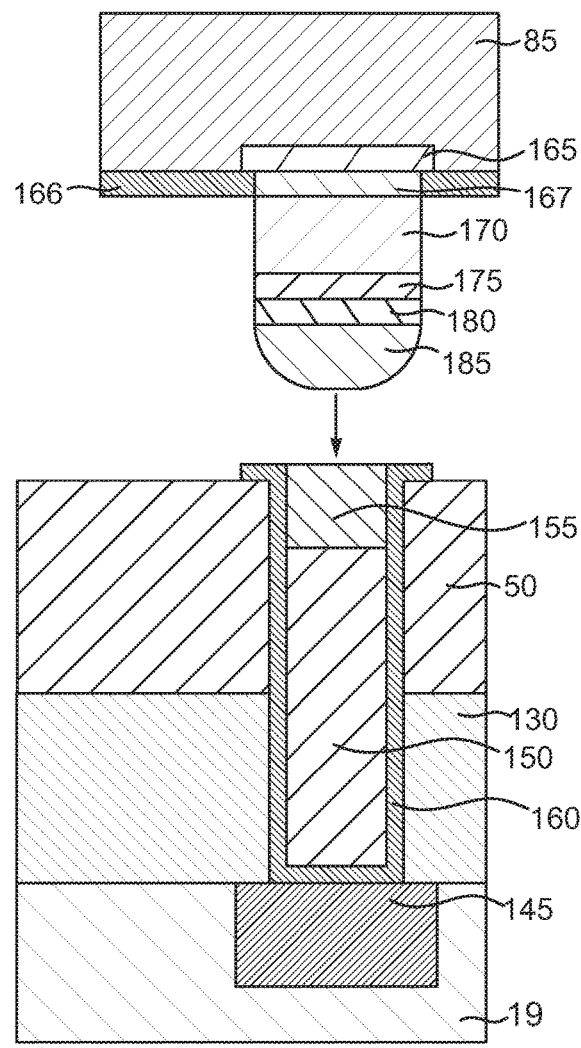
FIG. 16 is a sectional view depicting a portion of FIG. 15 at greater magnification.

The mounting of the interconnect chip 85 to the semiconductor chips 19 and 20 will now be described in conjunction with FIGS. 15 and 16. As shown in FIG. 15, the resist mask 260 depicted in FIGS. 13 and 14 is stripped using well-known ashing and solvent stripping techniques to leave the conductive pillars 100 and 115 projecting up from the semiconductor chips 19 and 20, respectively. Prior to mounting the interconnect chip 85, the combination of the semiconductor chips 19 and 20 and the molding layer 35 can undergo a material removal process such as a wet etch, to remove excess portions of the UBM structure 150 that are positioned on the polymer layer 50 but lateral to the pillars 100 and 115. This etch is necessary to prevent the subsequent electrical shorting between adjacent pillars 100 and 115, etc. Up to this point, the interconnect chip 85 is fabricated using various well-known techniques to establish not only the internal conductive traces 90 but also that portion of the conductive pathways 95 associated with the interconnect chip 85 and as depicted in FIG. 3. For example, FIG. 16 depicts the portion of FIG. 15 and in particular the small portion of the interconnect chip 85 circumscribed by the dashed square 290 at greater magnification. As described above, that portion of the conductive pathway 95 shown in FIG. 3 associated with the interconnect chip 85 consists of the conductor pad 165, the passivation structure 166, the seed layer 167, and the various layers 170, 175 and 180 followed by the solder cap 185, all which are depicted flipped over from the orientation reflected in FIG. 3. It should be noted that when the interconnect chip 85 is positioned on the polymer layer 50, a reflow is performed in order to establish metallurgical bonds between the solder caps 185 and the underlying nickel-gold caps 155 positioned on the micro pillars 150 of the semiconductor chips 19 and 20.

Figure 17:
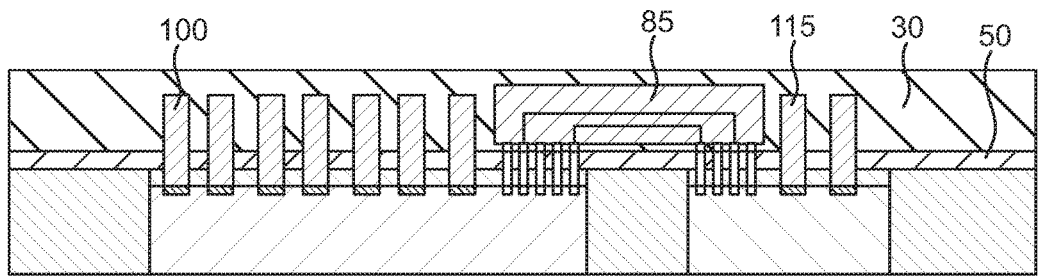
FIG. 17 is a sectional view depicting additional processing of the chips.
Figure 18:
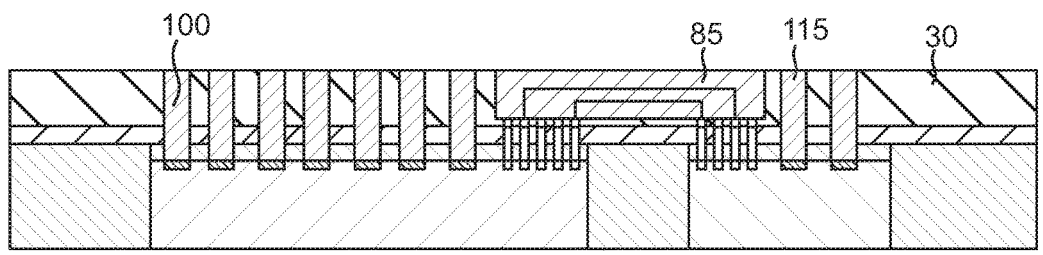
FIG. 18 is a sectional view depicting additional processing of the chips.
Figure 19:
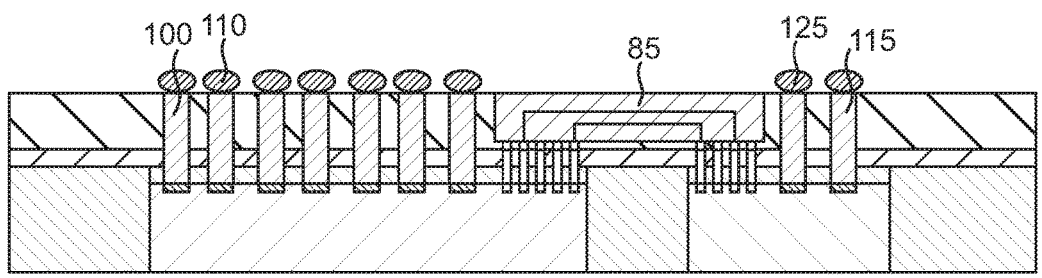
FIG. 19 is a sectional view depicting additional processing of the chips.

Next and as shown in FIG. 17, a second molding process is performed to form the molding layer 30 over the interconnect chip 85, the conductive pillars 100 and 115 and the otherwise exposed portions of the polymer layer 50. The molding layer 30 is fabricated using a compression molding process at about 165° C. for about 60 to 120 minutes and Sumitomo EME-G750 or G760 or the other molding materials disclosed herein. It is necessary to expose the conductive pillars 100 and 115 so the molding layer 30 undergoes a grinding process as shown in FIG. 18. This grinding process is designed to expose the conductive pillars 100 and 115 and, depending upon the height of the interconnect chip 85, can also thin the backside of the interconnect chip 85 as well. With the pillars 100 and 115 exposed as shown in FIG. 19, the solder interconnects 110 are fabricated on the pillars 100, the solder interconnects 125 are fabricated on the pillars 115. The solder interconnects 110 and 125 can be formed by pick and place placement of solder bumps, by well-known solder plating and/or paste stencil processes or other techniques.

Figure 20:
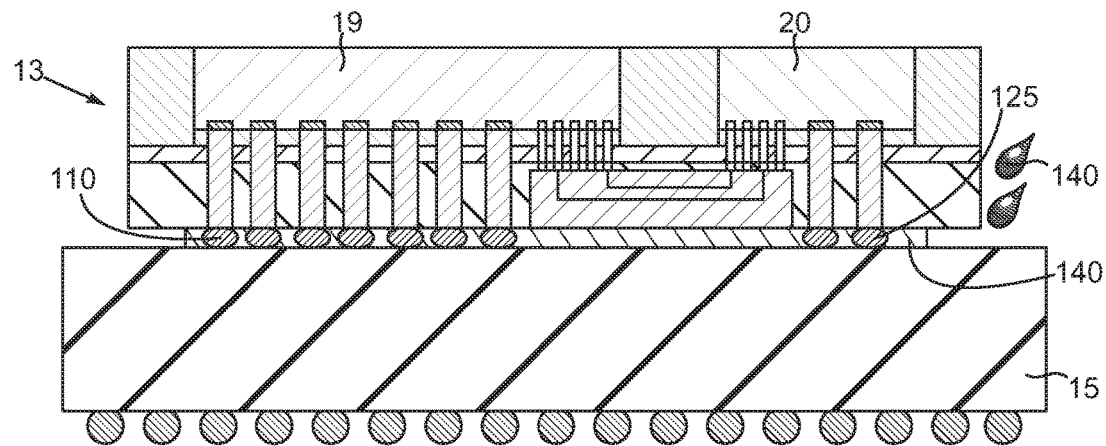
FIG. 20 is a sectional view depicting exemplary mounting of the chips on an exemplary circuit board.

Next and as shown in FIG. 20, the now completed molded chip combination 13 can be flipped over from the orientation shown in FIG. 19 and mounted to the circuit board 15 by way of a reflow process of the solder interconnects 110 and 125. Thereafter, the underfill 140 is established by dispensing underfill as a liquid and capillary action.

Figure 21:
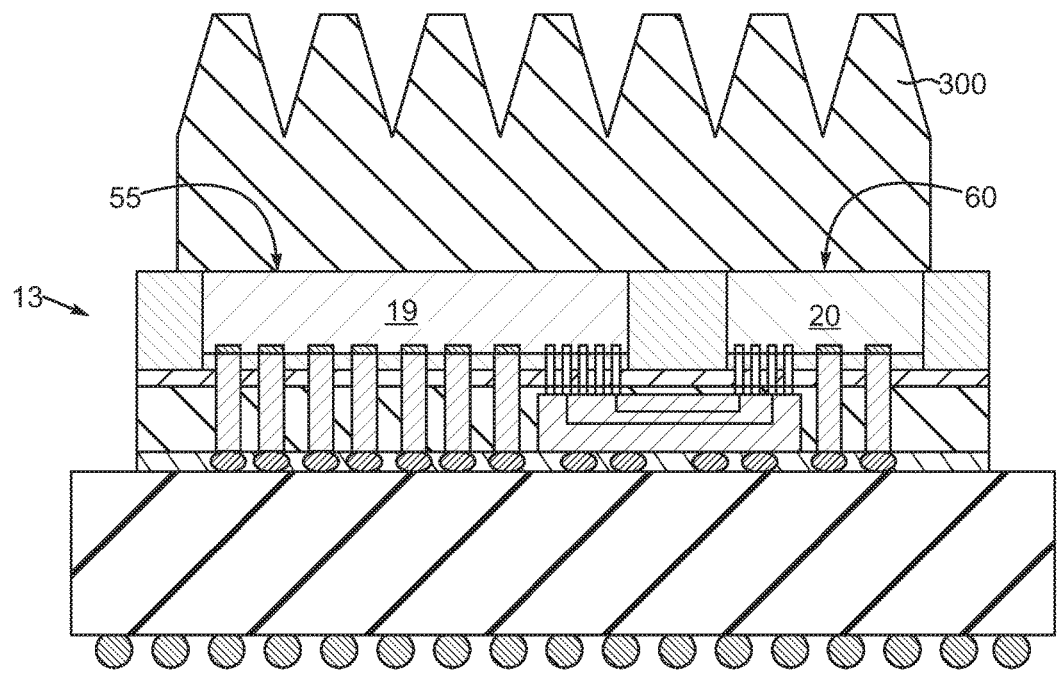
FIG. 21 is a sectional view depicting exemplary mounting of a heat sink on the chips.

For thermal management purposes, an optional heat spreader or sink 300 can be mounted on the molded chip combination 13 and placed in thermal contact with the semiconductor chips 19 and 20, respectively as shown in FIG. 21. A suitable thermal interface material, such as a thermal grease or paste (not shown), can be positioned between the heat spreader 300 and the upper surfaces 55 and 60 of the semiconductor chips 19 and 20, respectively.

Figure 22:
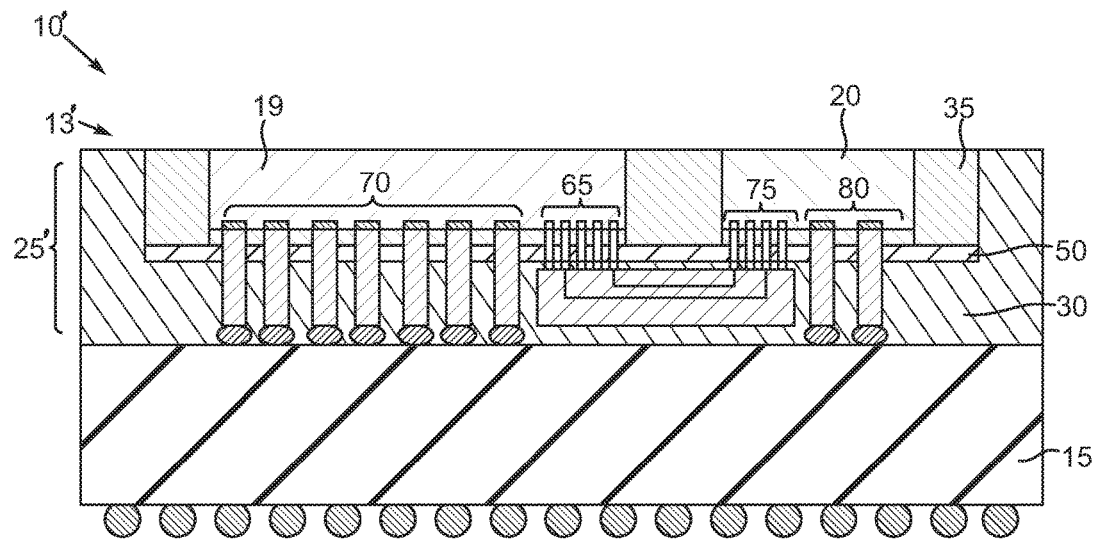
FIG. 22 is a sectional view like FIG. 2, but of an alternate exemplary semiconductor chip device with an alternate exemplary molded chip combination.
Figure 23:
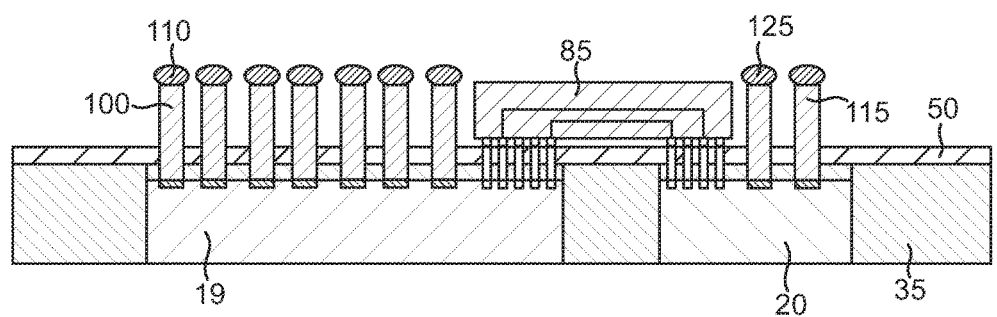
FIG. 23 is a sectional depicting exemplary interconnect chip mounting on the device of FIG. 22.
Figure 24:
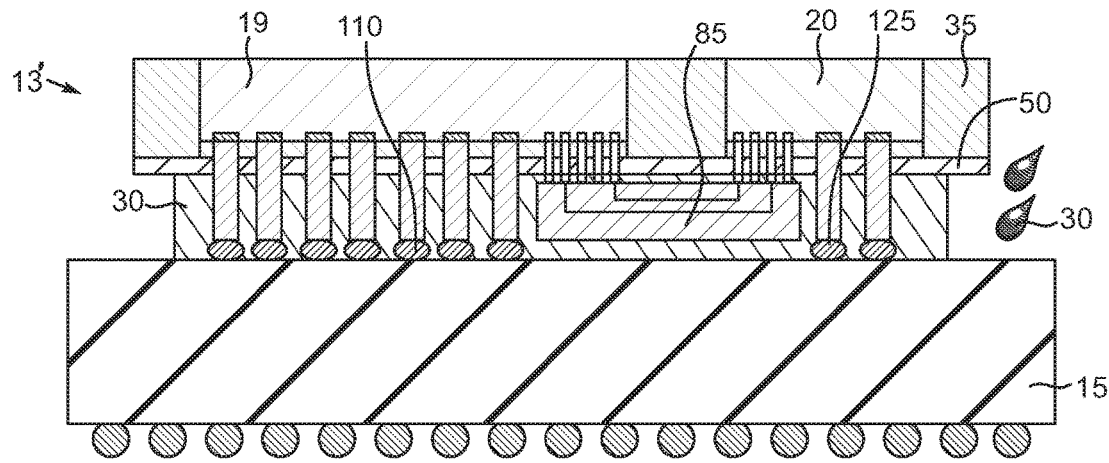
FIG. 24 is a sectional view depicting exemplary board mounting and molding.
Figure 25:
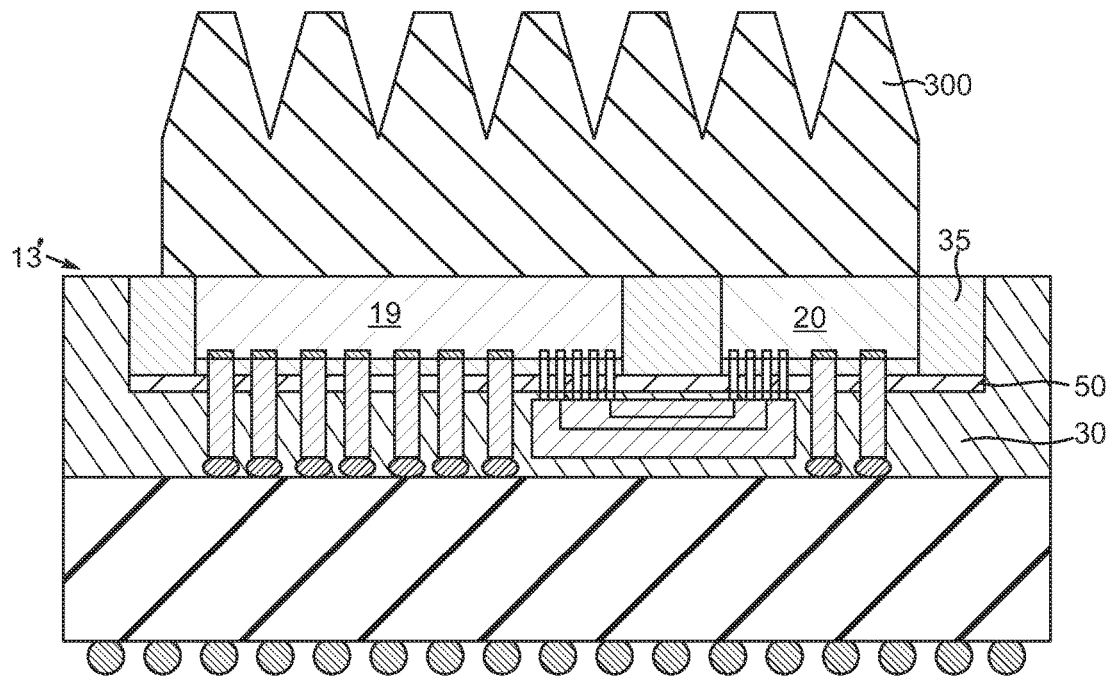
FIG. 25 is a sectional view depicting exemplary mounting of a heat sink on the molded chip combination.

FIG. 22 is a sectional view like FIG. 2, but of an alternate exemplary semiconductor chip device 10'. The semiconductor chip device 10' shares most attributes with the semiconductor chip device 10 depicted and described elsewhere herein. The chief difference is that, whereas the semiconductor chip device 10 utilizes the underfill material layer 140 as shown in FIG. 2, the semiconductor chip device 10' eliminates the underfill material layer 140 in favor of increasing the overall height of the molding layer 30 of an alternative molded chip combination 13'. The molding layer 35 and the polymer layer 50 are used as in the earlier described arrangement. However, as shown in FIG. 22, the molding layer 30, rather than terminating near or at the lower ends of the conductive pillars 110 and 115, instead extends down and molds to the circuit board 15 and also extends upwards to at least partially encapsulate the combination of the chips 19 and 20, the molding material 35 and the polymer layer 50. The fabrication steps described elsewhere herein to mold the semiconductor chips 19 and 20 with the molding layer 35 and the construction of the various conductor structures in and around the PHY region 65 and the non-PHY region 70 of the semiconductor chip 19 are used here as well. The PHY region 75 and the non-PHY region 80 of the semiconductor chip 20 will be repeated or be the same as described elsewhere herein for the semiconductor chip device 10. Similarly, the interconnect chip 85 will be constructed as generally described elsewhere herein for the semiconductor chip device 10. However, there are some process flow differences between fabrication processes used for the semiconductor chip device 10 and the semiconductor chip device 10', which will now be described initially in conjunction with FIG. 23. FIG. 23 depicts the molded combination of the semiconductor chips 19 and 20 and the molding layer 35, after fabrication of the polymer layer 50 and mounting of the interconnect chip 85. In addition, the conductive pillars 100 and 115 have been fabricated and exposed using the techniques described above leading to the depiction in FIG. 15. However, at this stage, the solder interconnects 110 and 125 are mounted on the conductive pillars 100 and 115, respectively. This can be accomplished using a drop process, which is essentially a pick and place process. It can also be possible to position a stencil (not shown) in order to place the solder interconnects 110 and 125. A brief reflow can be accomplished at this point in order to establish an initial metallurgical bonding between the solder interconnects 110 and the conductive pillars 100 and the solder interconnects 125 and the conductive pillars 115. Next and as shown in FIG. 24, the semiconductor chips 19 and 20 and the molding layer 35 along with the interconnect chip 85 can be flipped over from the orientation shown in FIG. 23 and mounted to the circuit board 15. This entails a reflow process to establish metallurgical connections between the solder interconnects 110 and 125 and conductive pads (not shown) of the circuit board 15. Next, molding material 30 can be molded between the polymer layer 50 and the circuit board 15 using transfer molding or other techniques to establish the molding layer 30 shown in completed form in FIG. 22. This establishes the completed molded chip combination 13'. As shown in FIG. 25, the optional heat spreader 300 can be mounted on the molded chip combination 13' as described above. Note that the molding process for the molding layer 30 could alternatively make the lateral edges of the molding layer 30 co-terminus with the lateral edges of the molding layer 35 and the polymer layer 50 if desired. Again, a thermal interface material (not shown) can be positioned between the heat sink 300 and the semiconductor chips 19 and 20.

Figure 26:
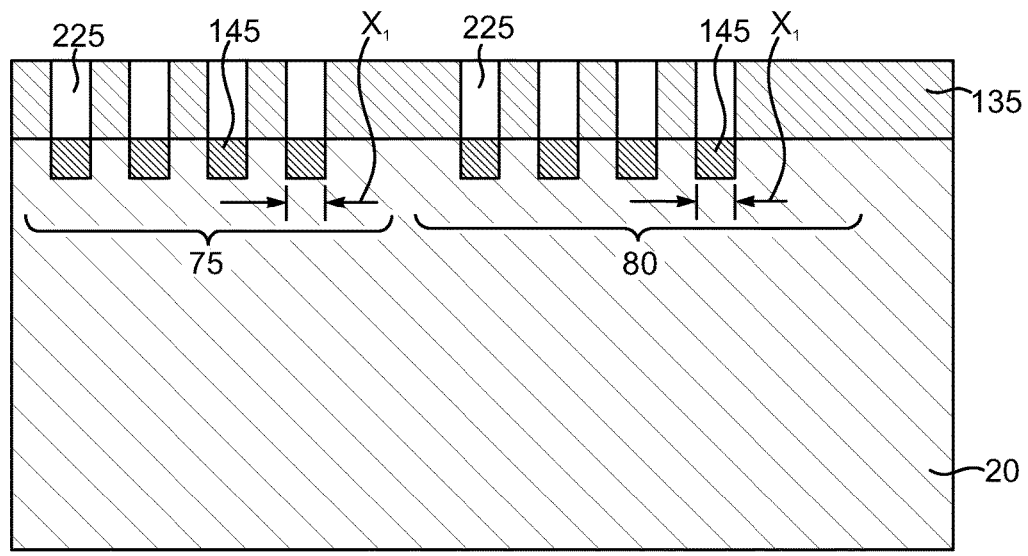
FIG. 26 is a sectional view depicting exemplary initial processing of small portions of PHY region and non-PHY region pads of a semiconductor chip.
Figure 27:
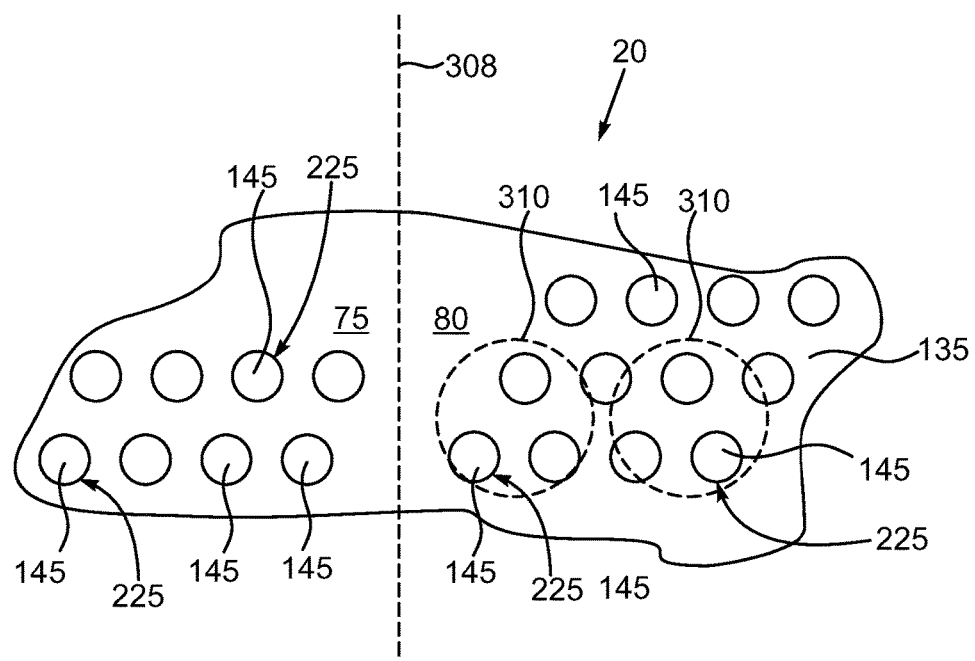
FIG. 27 is a plan view of the PHY region and non-PHY regions depicted in FIG. 26.
Figure 28:
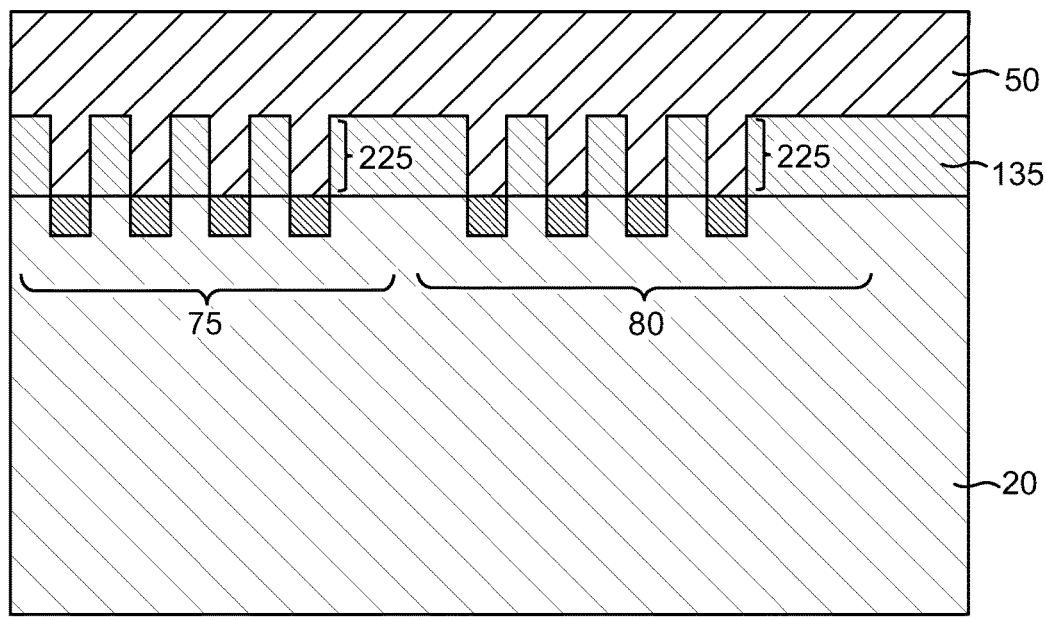
FIG. 28 is a sectional view like FIG. 26, but depicting exemplary additional processing of the chip.
Figure 29:
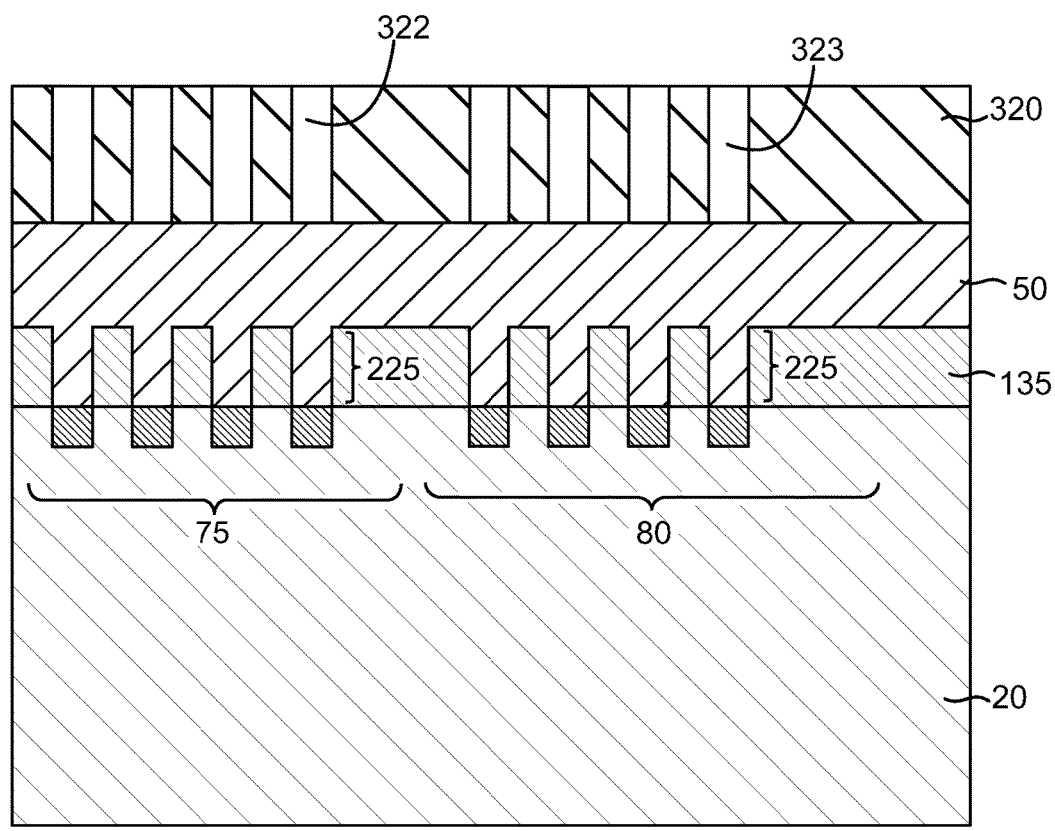
FIG. 29 is a sectional view like FIG. 28, but depicting exemplary additional processing of the chip.
Figure 30:
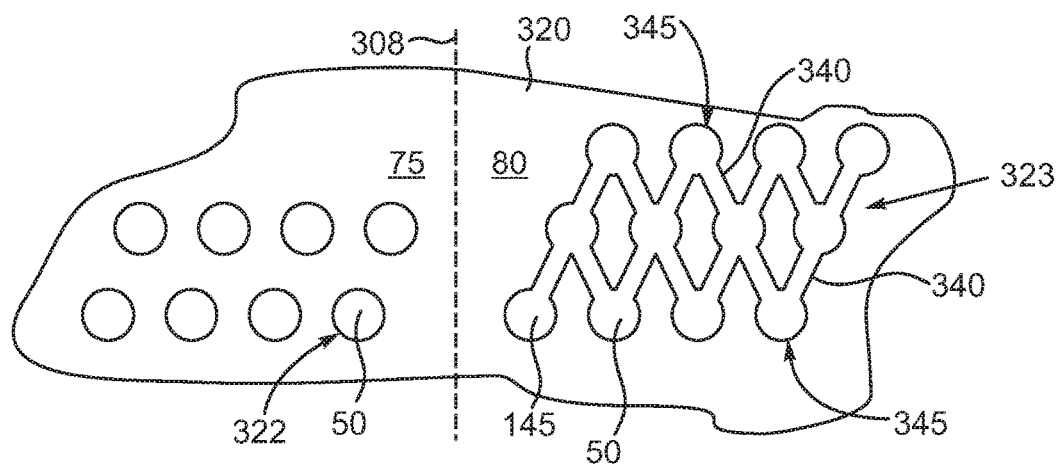
FIG. 30 is a plan view of the portion of the chip depicted in FIG. 29.
Figure 31:
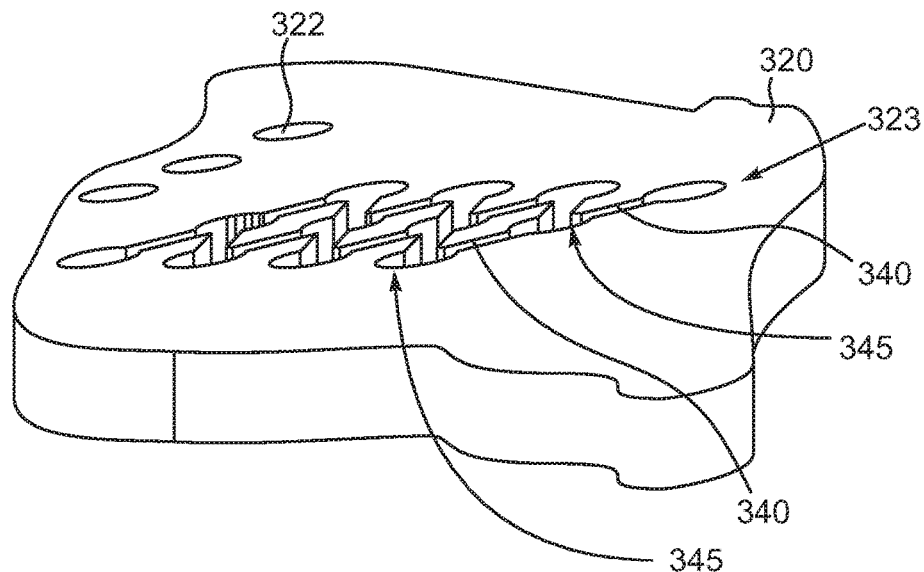
FIG. 31 is a pictorial view of the masking layer depicted in FIG. 30.
Figure 32:
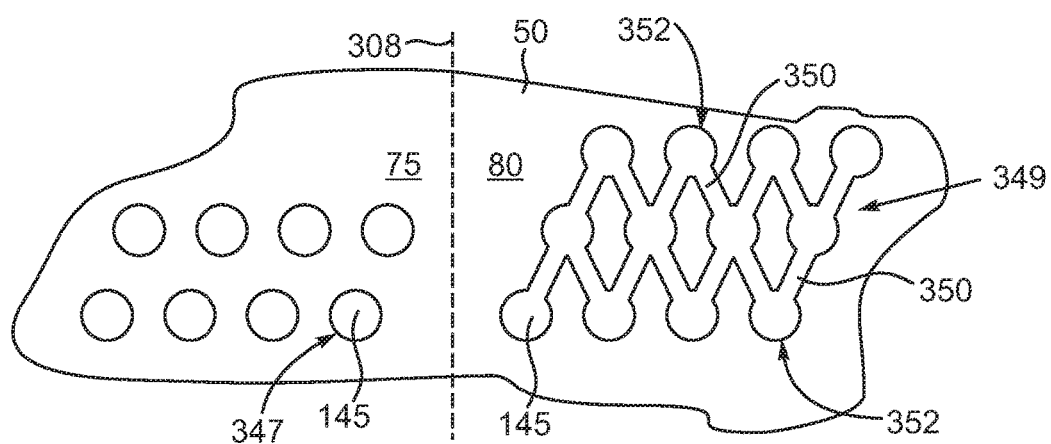
FIG. 32 is a plan view of the portion of the chip depicted in FIG. 29 but after additional processing.

In the foregoing disclosed arrangements, the conductor pads in the PHY regions 65 and 75 of the semiconductor chips 19 and 20 are more numerous and have some smaller dimension $x_1$ than the conductor pads of the non-PHY regions 70 and 80 with lateral dimensions $x_2$. However, the semiconductor chips 19 and 20 can be manufactured with a single lateral dimension $x_1$ for all of the conductor pads, that is, for both the PHY regions 65 and 75 and the non-PHY regions 70 and 80. However, this represents a technical complexity in that it is desirable to be able to use larger conductive pillars, such as the pillars 100 and 115, even if the non-PHY regions of a device 70 and 80 have the smaller lateral dimension $x_1$ size pads. A technical solution to this issue will be illustrated and described in conjunction with FIGS. 26, 27, 28, 29, 30, 31, 32, 33, 34 and 35 and initially with reference to FIG. 26. FIG. 26 is a sectional view of the semiconductor chip 20 and a portion of the PHY region 75 and a portion of the non-PHY region 80 thereof. Here, the PHY regions 75 includes plural conductor pads 120 with some lateral dimension $x_1$ that have been fabricated as described generally elsewhere herein. However, the non-PHY region 80, in lieu of the larger conductor pads 120 with the lateral dimension $x_2$ depicted elsewhere herein, has instead an additional plurality of conductor pads 145 with the lateral dimension $x_1$. This can occur where the semiconductor chip 20 is manufactured using the process that does not require constructing and patterning top level conductor pads with two separate lateral dimensions. The passivation structure 135 has been applied and patterned with plural openings 225 to all of the conductor pads 145 both in the PHY region 75 and the non-PHY region 80. FIG. 27 shows an overhead view of the passivation structure 135, the openings 225 as well as some of the underlying conductor pads 145. It should be understood that just a few of the conductor pads 145 are depicted and that the semiconductor chip can include hundreds or thousands of such pads depending on its complexity. The dashed line 308 in FIG. 27 and elsewhere in the figures represents the border between the PHY region 75 and the non-PHY region 80. The two dashed circles 310 represent the locations where the later-formed conductive pillars 115 destined to be in ohmic contact with the underlying conductor pads 145 will be formed. Note that smaller micro pillars 150 will be formed in ohmic contact with the conductor pads 145 in the PHY region 75. A technical goal is to be able to ultimately fabricate the large-size conductive pillars 115 at the locations of the dashed circles 310 in ohmic contact with the underlying undersized conductor pads 145. Initially and as shown in FIG. 28, the polymer layer 50 is applied to the passivation structure 130 of the semiconductor chip 20 over the PHY region 75 and the non-PHY region 80 and filling the openings 225. The polymer layer 50 preferably includes a photoactive compound. As shown in FIG. 29, a resist mask 320 is applied to the polymer layer 50 and patterned with suitable openings 322 that are in alignment with those openings 225 in the passivation structure 135 over the PHY region 75 and other suitable openings 323 that are in alignment with those openings 225 over the non-PHY region 80 in the passivation structure 135. The openings 322 and 323 are shown in plan and pictorial views in FIGS. 30 and 31, respectively. Note that the openings 322 and the openings 323 have different footprints. The openings 322 have footprints that track the underlying openings 225 in the PHY region 75. However, the openings 323 consist of a combination of cris-crossing connecting portions 340 and openings 345 where the openings 345 are aligned with the underlying 225 in the non-PHY region 80. With the mask 320 in place and patterned, the polymer layer 50 is exposed and developed, and the mask 320 stripped as shown in the plan view in FIG. 32 to yield openings 347 in the PHY region 75 and with the footprint of the mask openings 322 (see FIG. 31), and openings 349 of cris-crossing connecting portions 350 and openings 352 in the non-PHY region 80 with the footprint of the mask openings 323 (see FIG. 31). The underlying conductor pads 145 in both the PHY region 75 and the non-PHY region 80 are now exposed.

Figure 33:
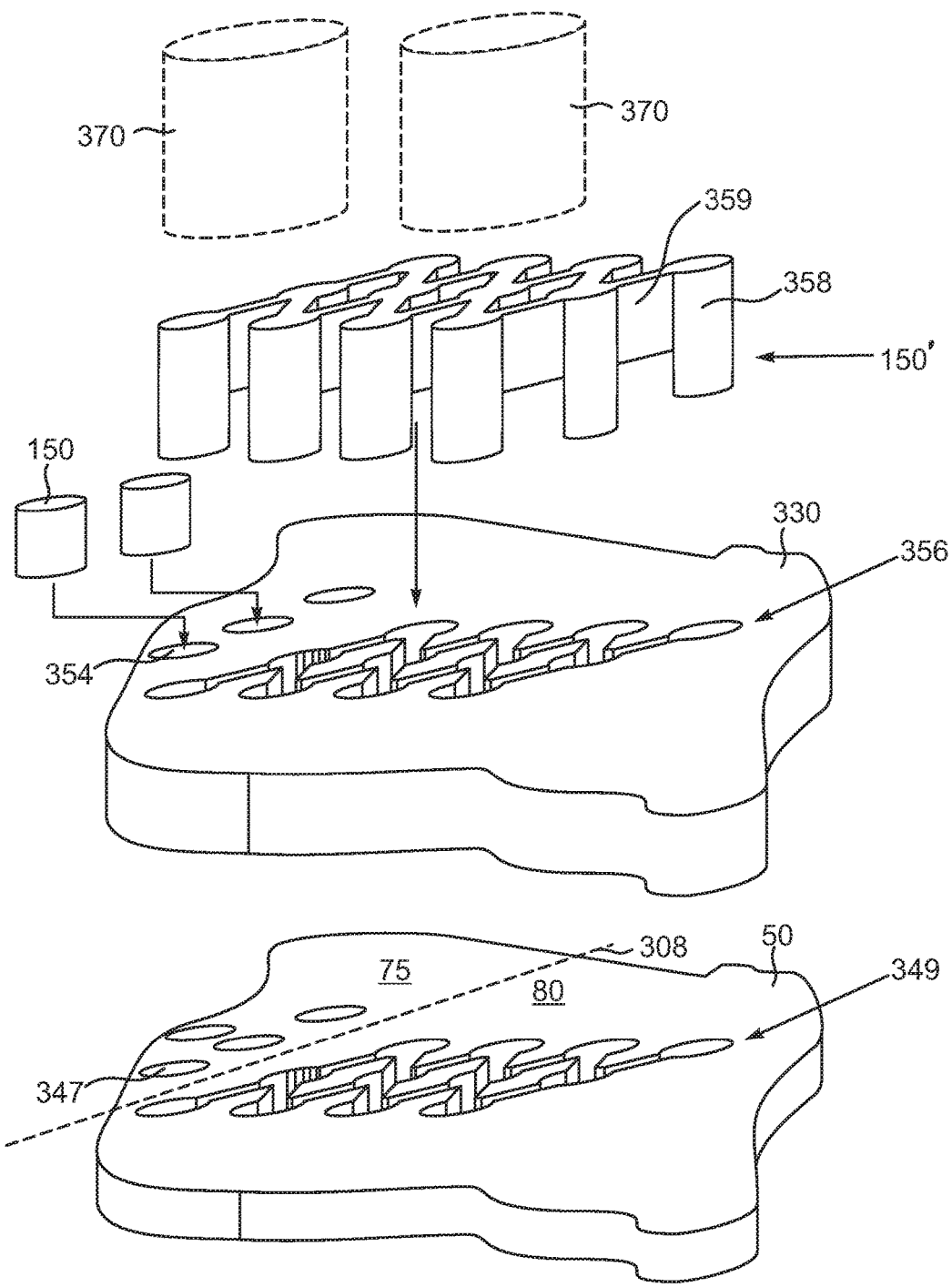
FIG. 33 is an exploded pictorial view depicting additional processing of the chip.

Next and as shown in the exploded pictorial view depicted in FIG. 33, another resist mask 330 is applied to the polymer layer 50 and patterned to provide appropriate openings 354 over the PHY region 75 that are in alignment with the openings 347 in the polymer layer 50 and another set of openings 356 over the non-PHY region 80 that are in alignment with the openings 349 in the passivation structure 135. The openings 354 have the same footprint as the openings 347 in the polymer layer 50 and the openings 356 have the same footprint as the openings 349 in the polymer layer 50. With the mask 330 in place, discrete conductive pillars 150 are fabricated in the openings 347 and interconnected conductive pillars 150' are fabricated in the openings 349 using plating and the materials described elsewhere herein. The conductive pillars 150 and the conductive pillars 150' will have the same metallurgical composition, but different footprints. The conductive pillars 150' consist of pillars 358 that extend down through the polymer layer 50 to the underlying conductor pads 145 (not visible) interconnected by conductor bars 359. It should be understood that, through subsequent processing, larger diameter conductive pillars 370 (in dashed) will be fabricated on top of the conductive pillars 150' in the non-PHY region 80. The plating mask 330 is ultimately stripped using the techniques described elsewhere herein to leave the conductive pillars 150 and conductive pillars 150'. Like the conductor bars 359, conductor traces (not shown) could also be fabricated in this way such that the polymer layer 50 enables fabrication of redistribution layer traces. The basic construction of the conductive pillars 150 in the PHY region 75 is the same general construction depicted in FIG. 11 for the conductive pillars 150. While the conductive pillars 150' will also have the same layers, the footprint thereof will differ from the conductive pillars 150 as shown in FIG. 33.

Figure 34:
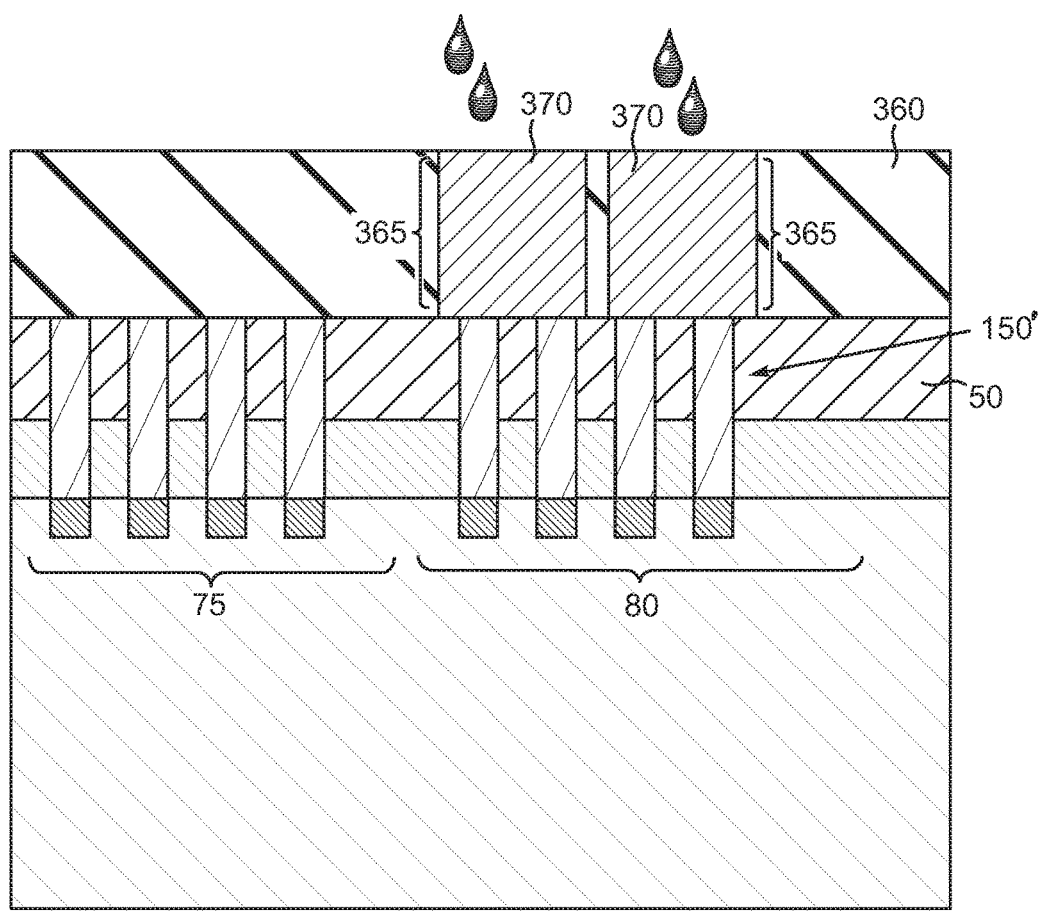
FIG. 34 is a sectional view like 28, but depicting exemplary additional processing of the chip.
Figure 35:
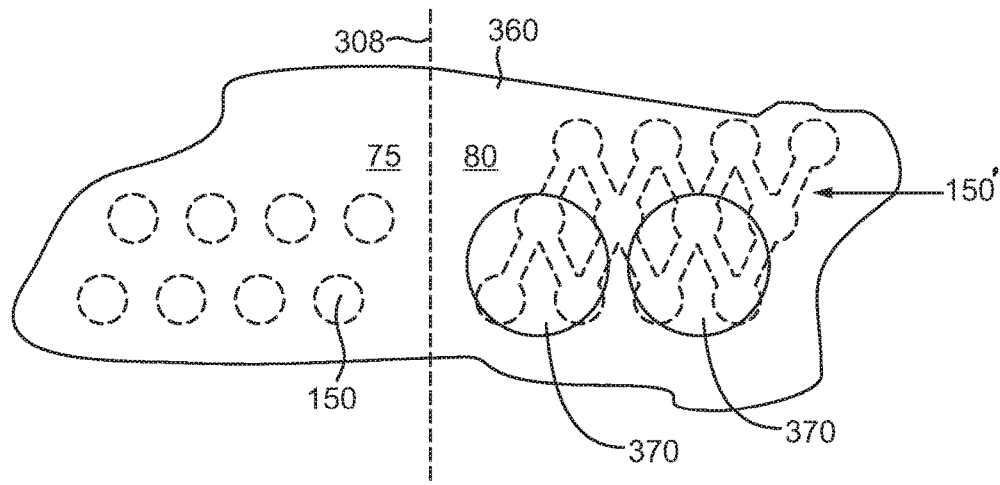
FIG. 35 is a plan view of a portion of the chip depicted in FIG. 34.

Next and as shown in FIG. 34, a plating mask 360 is fabricated over the polymer layer 50 and patterned with suitable openings 365 which are positioned and sized to correspond to the size and locations of the dashed circles 310 depicted in FIG. 27. The objective is to enable a subsequent plating process to establish the conductive pillars 370 that are in ohmic contact with the underlying interconnected conductive pillars 150' that consist of the interconnected pillars 358 and bars 359 shown in FIG. 33. FIG. 35 shows an overhead view of the plating mask 360 and the plated conductive pillars 370 over the non-PHY region 80. Note that the underlying discrete conductive pillars 150 are obscured (and thus shown in dashed) by the plating mask 460 and the interconnected conductive pillars 150 are obscured by both the conductive pillars 370 and a portion of the plating mask 360 and the conductive pillars 150 are similarly obscured and thus shown in dashed. The plating mask 360 is ultimately stripped using well-known techniques.

Figure 36:
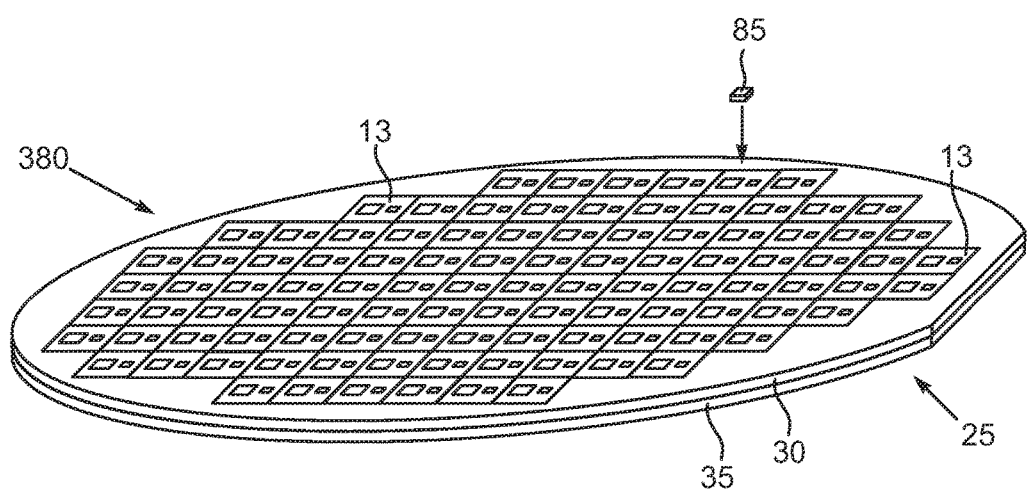
FIG. 36 is a pictorial view of an exemplary reconstituted molded chip combination.

The skilled artisan will appreciate that the molded chip combos 13 described herein can be fabricated as single units or en masse in a wafer-like structure (a reconstituted wafer) 380 in what amounts to a wafer level process. For example, and as shown in FIG. 36, which is a pictorial view, the plural molded chip combinations 13 can be molded together using, for example, the molding layers 35 and 30 in large numbers at the same time and if desired, interconnect chips 85 can be mounted on the molded chip combinations 13 at this wafer level stage. Thereafter, the molded chip combinations 13 can be singulated into the individual units depicted in the other figures herein.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A molded chip combination, comprising:
a first semiconductor chip having a first PHY region;
a second semiconductor chip having a second PHY region;
an interconnect chip interconnecting the first PHY region to the second PHY region;
a first molding layer laterally joining together the first semiconductor chip and the second semiconductor chip;
a second molding layer at least partially encapsulating the interconnect chip; and
a polymer layer positioned between the first molding layer and the second molding layer.

2. The molded chip combination of claim 1, wherein the first semiconductor chip includes a first plurality of interconnects to connect to a circuit board when the molded chip combination is mounted on the circuit board and the second semiconductor chip includes a second plurality of interconnects to connect to the circuit board when the molded chip combination is mounted on the circuit board.

3. The molded chip combination of claim 2, wherein the first semiconductor chip includes a first non-PHY region connected to the first interconnects and the second semiconductor chip includes a second non-PHY region connected to the second interconnects.

4. The molded chip combination of claim 1, wherein the first semiconductor chip includes a first non-PHY region, the first semiconductor chip PHY region having a first group of conductor pads each having a first lateral dimension and the first semiconductor chip non-PHY region has a second group of conductor pads each having substantially the same first lateral dimension, the polymer layer having a plurality of openings aligned with the first group of conductor pads and a plurality of interconnected openings aligned with the second group of conductor pads, the polymer layer having a conductive pillar in each of the openings and interconnected conductive pillars in each of the interconnected openings.

5. The molded chip combination of claim 4, comprising another conductive pillar on the interconnected conductive pillars, the another conductive pillar having second lateral dimension larger than the first lateral dimension.

6. The molded chip combination of claim 1, comprising a circuit board and the molded chip combination mounted on the circuit board.

7. The molded chip combination of claim 1, wherein the first semiconductor chip comprises a processor and the second semiconductor chip comprises a memory chip.

8. A molded chip combination, comprising:
a first semiconductor chip having a first PHY region and a first non-PHY region;
a second semiconductor chip having a second PHY region and a second non-PHY region;
an interconnect chip interconnecting the first PHY region to the second PHY region;
a first molding layer laterally joining together the first semiconductor chip and the second semiconductor chip;
a second molding layer joined to the first molding layer and at least partially encapsulating the interconnect chip and the first molding layer; and
a polymer layer positioned between the first molding layer and the second molding layer.

9. The molded chip combination of claim 8, wherein the first semiconductor chip includes a first plurality of interconnects to connect to a circuit board when the molded chip combination is mounted on the circuit board and the second semiconductor chip includes a second plurality of interconnects to connect to the circuit board when the molded chip combination is mounted on the circuit board.

10. The molded chip combination of claim 9, wherein the first semiconductor chip first non-PHY region is connected to the first interconnects and the second semiconductor chip second non-PHY region is connected to the second interconnects.

11. The molded chip combination of claim 8, wherein the first semiconductor chip PHY region includes a first group of conductor pads each having a first lateral dimension and the first semiconductor chip non-PHY region includes a second group of conductor pads each having substantially the same first lateral dimension, the polymer layer having a plurality of openings aligned with the first group of conductor pads and a plurality of interconnected openings aligned with the second group of conductor pads, the polymer layer having a conductive pillar in each of the openings and interconnected conductive pillars in each of the interconnected openings, the first semiconductor chip non-PHY region including another conductive pillar on the interconnected conductive pillars, the another conductive pillar having second lateral dimension larger than the first lateral dimension.

12. The molded chip combination of claim 8, comprising a circuit board and the molded chip combination mounted on the circuit board.

13. The molded chip combination of claim 8, wherein the first semiconductor chip comprises a processor and the second semiconductor chip comprises a memory chip.

14. A method of manufacturing a molded chip combination, comprising:
    interconnecting a first PHY region of a first semiconductor chip to a second PHY region of a second semiconductor chip with an interconnect chip; and
    molding together the first semiconductor chip and the second semiconductor chip with a first molding layer;
    at least partially encapsulating the interconnect chip with a second molding layer; and
    applying a polymer layer between the first molding layer and the second molding layer.

15. The method of claim 14, comprising fabricating a first plurality of interconnects on the first semiconductor chip to connect to a circuit board when the molded chip combination is mounted on the circuit board and a second plurality of interconnects on the second semiconductor chip to connect to the circuit board when the molded chip combination is mounted on the circuit board.

16. The method of claim 15, wherein the first semiconductor chip includes a first non-PHY region connected to the first interconnects and the second semiconductor chip includes a second non-PHY region connected to the second interconnects.

17. The method of claim 14, wherein the first semiconductor chip includes a first non-PHY region, the method comprises fabricating a first group of conductor pads of the first semiconductor chip PHY region each having a first lateral dimension and a second group of conductor pads of the first semiconductor chip non-PHY region each having substantially the same first lateral dimension, providing the polymer layer with a plurality of openings aligned with the first group of conductor pads and a plurality of interconnected openings aligned with the second group of conductor pads, and fabricating a conductive pillar in each of the openings and interconnected conductive pillars in each of the interconnected openings.

18. The method of claim 17, comprising positioning another conductive pillar on the interconnected conductive pillars, the another conductive pillar having second lateral dimension larger than the first lateral dimension.

19. The method of claim 14, comprising mounting the molded chip combination on a circuit board.

20. The method of claim 14, wherein the first semiconductor chip comprises a processor and the second semiconductor chip comprises a memory chip.

* * * * *